US011542632B1

(12) United States Patent
Sherrill et al.

(10) Patent No.: US 11,542,632 B1
(45) Date of Patent: Jan. 3, 2023

(54) METHODS FOR PRODUCING 2D MATERIALS BY MOVING FORMING LAYERS DISPOSED ON CARRIERS THROUGH A REACTION CHAMBER OPEN TO THE ATMOSPHERE

(71) Applicant: General Graphene Corp., Knoxville, TN (US)

(72) Inventors: James Vig Sherrill, Clinton, TN (US); Gregory E. Erickson, Knoxville, TN (US)

(73) Assignee: General Graphene Corp., Knoxville, TN (US)

( * ) Notice: Subject to any disclaimer, the term of this patent is extended or adjusted under 35 U.S.C. 154(b) by 87 days.

(21) Appl. No.: 16/709,247

(22) Filed: Dec. 10, 2019

Related U.S. Application Data

(62) Division of application No. 15/362,146, filed on Nov. 28, 2016, now Pat. No. 10,533,264.

(Continued)

(51) Int. Cl.
*C30B 25/14* (2006.01)
*C30B 25/12* (2006.01)
(Continued)

(52) U.S. Cl.
CPC ............. *C30B 25/12* (2013.01); *C30B 25/10* (2013.01); *C30B 25/14* (2013.01); *C30B 29/02* (2013.01)

(58) Field of Classification Search
CPC ....... C30B 25/00; C30B 25/02; C30B 25/025; C30B 25/10; C30B 25/12; C30B 25/14;
(Continued)

(56) References Cited

U.S. PATENT DOCUMENTS 5,316,579 A    5/1994  McMillan et al.
5,652,021 A    7/1997  Hunt et al.
(Continued)

FOREIGN PATENT DOCUMENTS

CN        103320768 A       9/2013
WO    WO-2014077507 A1 *    5/2014    ........... C01B 32/186
WO       2015059340 A1       4/2015

OTHER PUBLICATIONS

Kobayashia, Toshiyuki, et al., Production of a 100-m-long high-quality graphene transparent conductive film by roll-to-roll chemical vapor deposition and transfer process, Applied Physics Letters, vol. 102, 2013.

(Continued)

*Primary Examiner* — Kenneth A Bratland, Jr.
(74) *Attorney, Agent, or Firm* — Luedeka Neely Group, P.C.

(57) ABSTRACT

A method of making 2D material such as graphene includes introducing a purge gas into a gas confining space within a reaction chamber to purge the gas confining space of oxygen; introducing a donor gas into the gas confining space within the reaction chamber; moving a forming layer within the gas confining space within the reaction chamber when the donor gas is within the gas confining space; and heating the forming layer within the gas confining space to a temperature sufficient to form 2D material while the gas confining space is open to a surrounding atmosphere.

20 Claims, 16 Drawing Sheets

Related U.S. Application Data

(60) Provisional application No. 62/262,145, filed on Dec. 2, 2015.

(51) Int. Cl.
*C30B 29/02* (2006.01)
*C30B 25/10* (2006.01)

(58) Field of Classification Search
CPC ....... C30B 25/16; C30B 25/165; C30B 29/00; C30B 29/02; C30B 29/04; C30B 35/00; C30B 35/005; Y10T 117/00; Y10T 117/10; Y10T 117/1004; Y10T 117/1008; Y10T 117/1016; Y10T 117/102; C23C 16/00; C23C 16/22; C23C 16/26; C23C 16/44; C23C 16/4412; C23C 16/455; C23C 16/45502; C23C 16/45512; C23C 16/45519; C23C 16/45521; C23C 16/45563; C23C 16/45565; C23C 16/458; C23C 16/46; C23C 16/52; C23C 16/54; C23C 16/545
USPC .............. 117/84, 88, 98, 102, 104, 200–202, 117/204–205, 928–929
See application file for complete search history.

(56) References Cited

U.S. PATENT DOCUMENTS

| | | | |
|---|---|---|---|
| 5,759,287 A | 6/1998 | Chen et al. | |
| 5,776,254 A | 7/1998 | Yuuki et al. | |
| 7,952,088 B2 | 5/2011 | Anderson et al. | |
| 8,470,400 B2 | 6/2013 | Colombo et al. | |
| 8,916,057 B2 | 12/2014 | Hong et al. | |
| 9,145,302 B2 | 9/2015 | Choi et al. | |
| 9,388,048 B1 | 7/2016 | Zhou et al. | |
| 9,428,394 B2 | 8/2016 | Tour et al. | |
| 9,845,551 B2 | 12/2017 | Tour et al. | |
| 2004/0089237 A1* | 5/2004 | Pruett | C23C 16/26 118/719 |
| 2006/0278497 A1* | 12/2006 | White | C23C 14/568 198/339.1 |
| 2009/0203194 A1 | 8/2009 | Tanaka | |
| 2011/0195207 A1 | 8/2011 | Hong et al. | |
| 2011/0206485 A1* | 8/2011 | Clerkx | C23C 14/505 414/217 |
| 2011/0226180 A1 | 9/2011 | Hasegawa | |
| 2011/0308463 A1* | 12/2011 | He | C30B 25/14 118/724 |
| 2013/0011574 A1 | 1/2013 | Kobayashi et al. | |
| 2013/0174968 A1 | 7/2013 | Vlassiouk et al. | |
| 2015/0050482 A1 | 2/2015 | Ruoff et al. | |
| 2015/0266258 A1 | 9/2015 | Vlassiouk et al. | |
| 2015/0307358 A1* | 10/2015 | Yoon | C01B 32/186 427/172 |

OTHER PUBLICATIONS

Materials from Liquid Precursors and Inert Atmosphere Materials Processing, LightMAT, https://lightmat.org/capabilities/national-renewable-energy-laboratory/materials-liquid-precursors-and-inert-atmosphere, Accessed Aug. 19, 2019.

Obraztsov, A.N., et al., Chemical vapor deposition of thin graphite films of nanometer thickness, Carbon, vol. 45, 2007, pp. 2017-2021.

* cited by examiner

METHODS FOR PRODUCING 2D MATERIALS BY MOVING FORMING LAYERS DISPOSED ON CARRIERS THROUGH A REACTION CHAMBER OPEN TO THE ATMOSPHERE

CROSS-REFERENCE TO RELATED APPLICATIONS

The present application claims priority as a divisional application of U.S. application Ser. No. 15/362,146 filed Nov. 28, 2016, entitled Apparatus for Producing Graphene and Other 2D Materials, which claimed priority as a non-provisional application to U.S. Provisional Application Ser. No. 62/262,145 filed Dec. 2, 2015, and entitled Large Scale Machine for Manufacture of Graphene and 2D Materials, the contents of which are both incorporated by reference as if fully set forth herein.

FIELD OF INVENTION

The present invention relates to the field of a method and apparatus for large-scale manufacturing of 2D materials, such as graphene, and particularly relates to a method and apparatus in which a 2D material is formed on a train of forming sheets moving through a quartz furnace.

BACKGROUND AND SUMMARY OF INVENTION

Graphene and other 2D materials are formed with large two dimensional crystalline structures, and they are generally highly useful materials, but they are difficult and expensive to manufacture. A machine and method for making such materials is disclosed herein that significantly reduces the cost of 2D materials, and the technique is scalable, meaning it can be made larger and faster with relative ease.

In one embodiment, an apparatus for producing a 2D material, such as graphene, includes a forming sheet suitable for growing (forming) the 2D material, and the forming sheet is disposed on the surface of a carrier substrate. A furnace is provided in a configuration to form a confining space around the carrier substrate and the forming sheet, and the confining space is open to atmosphere around the furnace such that gas may flow out of the confining space to atmosphere. The furnace also includes a support configured to support the carrier substrate in the furnace, and within the furnace, a first furnace surface is disposed immediately adjacent to and spaced apart from the forming sheet when the carrier substrate is disposed on the support. In this configuration, a volume is formed between the first furnace surface and the forming sheet, and such volume facilitates gas flow within the furnace to effectively and efficiently deposit large crystalline structures of 2D material onto the forming sheet. At least one supply port provides a flow of gas into the volume, and a gas supply provides a flow of purge gas through the supply port to purge the volume and also supplies a flow of donor gas through the supply port and into the volume. A heater within the furnace heats the forming sheet to a temperature sufficient to form 2D material, such as graphene, on the forming sheet when a donor gas is supplied into the volume.

The purge gas is chosen to remove elements, molecules or compounds that would interfere with the production of the 2D material. For example, oxygen would typically interfere with the production of 2D material, such as graphene, and oxygen may be purged with a gas such as argon or nitrogen. The donor gas is chosen to supply the material needed to form the 2D material. For example, to form graphene the donor gas should supply carbon atoms and one appropriate donor gas would be methane. To make another 2D material with this apparatus and method the donor gas is changed to donate the desired element or molecule and the operating parameters (temperature and forming sheet material) are adjusted for the desired 2D material.

In the production of 2D material, the furnace may be constructed in whole or part of quartz. The quartz plate may be used to form the first furnace surface, and multiple ports are formed in the quartz plate extending through the first furnace surface for delivering gases to the confining space in the furnace between the first furnace surface and the forming sheet. Multiple ports are connected to a plurality of passageways formed in the quartz plate, and the passageways are connected to a gas supply. Purge gases and donor gases are transmitted through the passageways to the plurality of ports for first purging the volume inside the furnace and then providing the donor gas to form 2D material on the forming sheet within the furnace. The heater may be disposed adjacent to the quartz plate on the opposite side of the quartz plate from the first furnace surface such that the heater and the forming sheet are positioned on opposite sides of the quartz plate and heat from the heater is transmitted through the quartz plate to the forming sheet.

The first furnace surface and the forming sheet are configured so that the volume between them has a rectangular cross-section, with the width of the cross-section being larger than the height of the cross-section. The width is at least 3 times the height but the width is less than 1,000,000 times the height. Preferably, the width is less than 1000 times the height. The configuration of the volume combined with the configuration of the ports and the flow rates of the gases is designed to produce a substantially nonturbulent, laminar flow of the donor gases across the forming sheet. The purge gases will also have the nonturbulent laminar flow across the forming sheet which will increase the efficiency with which the purging process takes place.

In one embodiment, multiple ports are formed in the first furnace surface and are disposed in a pattern extending across the first furnace surface. Thus, the ports are disposed adjacent to the forming sheet in a pattern that extends across the forming sheet from one side to an opposite side forming sheet. This configuration will cause a desired even distribution of the gases across the forming sheet. A plurality of patterns may be used. For example, one pattern may be a line of ports extending across the first furnace surface and the second pattern may be V-shaped with a point of the V disposed in the mid-region of the surface and two sides of the V extending across the surface.

In accordance with a more particular embodiment, the furnace may be configured to form a confining space around the carrier substrate and the forming sheet, and the confining space may be open to the atmosphere around the furnace. In this configuration, gas may flow out of the furnace, but the confining space will restrict the flow of gas out of the furnace so that the confining space is continuously filled with the desired gas. Also, an entrance may be formed in the furnace, penetrating the confining space of the furnace and dimensioned to receive the carrier substrate and forming sheet. The entrance may allow gases to flow out of the furnace, but it will be part of the confining space and will restrict the flow of gases out of the confining space such that a desired gas is maintained within the confining space. A transport mechanism is provided for moving the carrier substrate and the forming sheet into the entrance of the furnace and within the furnace along a direction of travel. An exit, similar to the entrance, is also formed in the furnace penetrating the confining space so that the transport mechanism may move the carrier substrate and the forming sheet along the direction of travel and out of the furnace through the exit.

A gas chamber may be formed around the confining space of the surface for capturing and containing the purge gases and the donor gases that flow out of the furnace. Thus, a gas atmosphere is formed within the gas chamber around the furnace that is substantially free of undesirable gases, such as oxygen. Thus, the gas chamber will protect the furnace from infiltration of undesirable gases from outside the furnace. The gas chamber is preferably formed by a hood system that contains the entire furnace, and gases within the hood system may be controlled by a variety of mechanisms. For example, gases may be released from the hood system at a controlled rate that is substantially equal to the rate at which gases are introduced into the furnace. Thus, the hood system may remain slightly pressurized with respect to the outside atmosphere so that gases flow out of the furnace into the gas chamber, and out of the gas chamber into the surrounding environment or atmosphere.

The furnace may also be provided with a plurality of carrier substrates and the forming sheet may be one or more forming sheets suitable for growing graphene with at least one forming sheet disposed on each of the plurality of carrier substrates. So, the number of forming sheets may be equal to the number of carrier substrates or may be greater than the number of carrier substrates. Multiple forming sheets may be carried on each carrier substrate. Alternatively, a single forming sheet could be carried by multiple carrier substrates. In such case, at least one forming sheet would still be disposed on each of the plurality of carrier substrates. The transport mechanism is configured to move the plurality of carrier substrates into the entrance of the furnace, through the furnace along a travel path and out the exit of the furnace, so that graphene is grown on each forming sheet as it is heated and passed through the donor gases in the furnace.

The method of making graphene as described above may be described as introducing a purge gas into a space within a furnace to purge the space of undesirable gases such as oxygen and introducing a donor gas into the space. A forming sheet suitable for forming graphene is moved within the space when the donor gases are within the space, and the forming sheet is heated within the space to a temperature sufficient to form 2D material. Thus, 2D material is formed on the moving forming sheet within the furnace.

In accordance with a more particular method of making 2D material, multiple carrier substrates are used and new carrier substrates are continuously moved into the furnace to form a train of carrier substrates that moves into and through the furnace. At least one forming sheet is disposed on each carrier substrate and each forming sheet is heated as it moves through the furnace to a temperature sufficient to form 2D material on the forming sheet. After the forming sheet is heated, each forming sheet is exposed to a donor gas to form 2D material on the forming sheet. Then, each carrier and forming sheet is moved out of the furnace through the exit.

In accordance with another aspect of the method, purge gases are introduced into a confining space within the furnace and into a gas chamber surrounding the furnace. Thus, purge gases continuously flow into and out of the confining space and the gas chamber until the gas chamber and space are substantially oxygen free. Then, donor gases are introduced into the confining space and the donor gases flow out of the furnace into the gas chamber. At least some of the purge gas and the donor gas that escapes from the confining space within the furnace is captured and retained in the gas chamber to maintain an environment in the gas chamber around the furnace that is substantially free of undesirable gases such as oxygen.

BRIEF DESCRIPTION OF THE DRAWINGS

The present invention may best be understood by considering non-limiting examples described below when considered in conjunction with the drawings in which.

DETAILED DESCRIPTION

Figure 1:
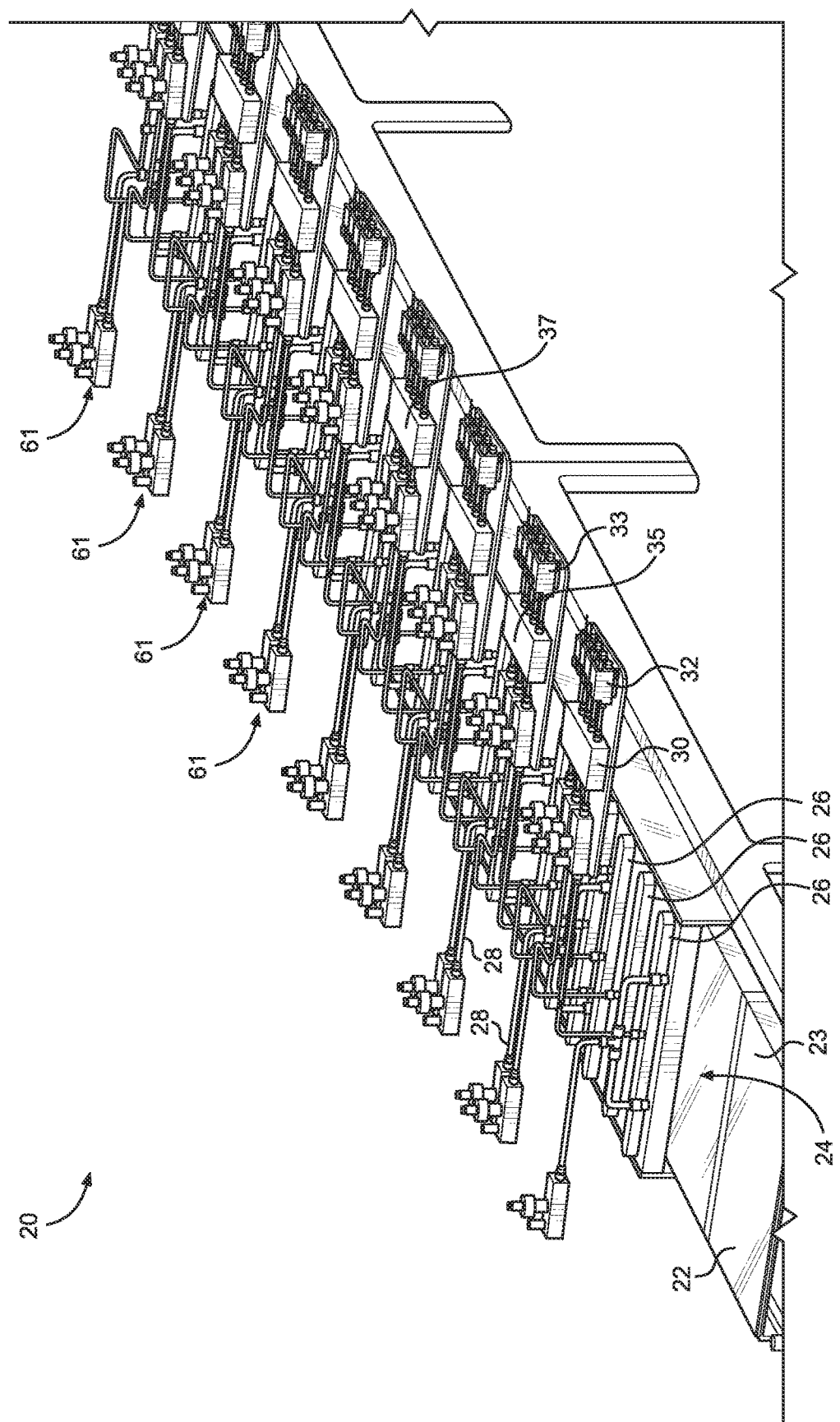
FIG. 1 is a perspective view of a furnace having multiple modular sections for manufacturing 2D materials such as graphene.
Figure 2:
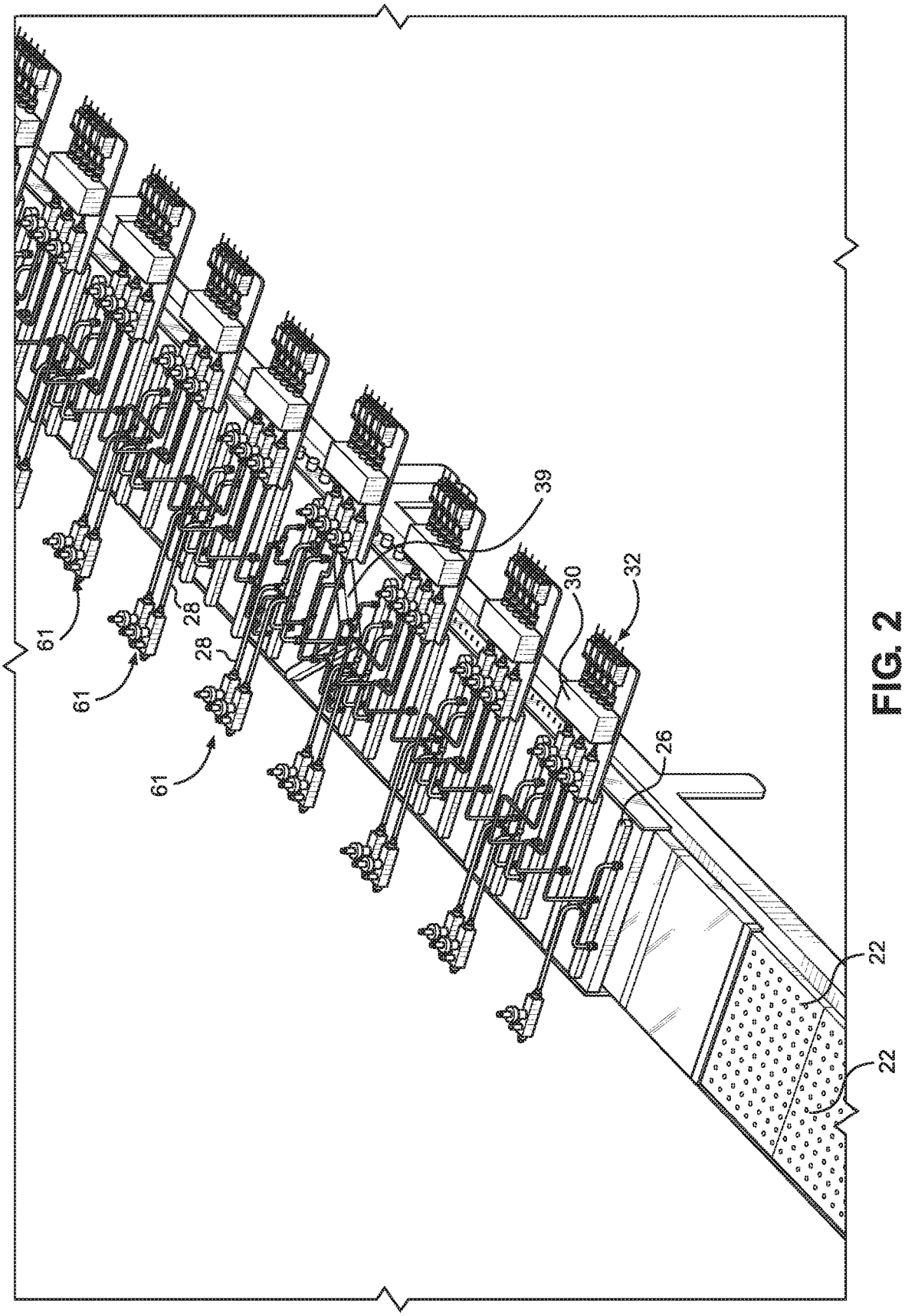
FIG. 2 is a different perspective view of the furnace showing cartridges being inserted into the entrance of the furnace.

One embodiment of a 2D manufacturing machine 20 is shown in the FIGS. 1 and 2 and this particular machine is well suited for manufacturing graphene. In the discussion below, these embodiments will be discussed with respect to graphene, but it will be understood that the machine and methods may also be applied to the manufacture of other 2D materials. This particular embodiment has 11 separate sections 61 with each section 61 receiving water through water pipes 28 for cooling the section. Thus, the sections 61 may be identified as the equipment attached to the grouped water pipes 28. The 11 sections 61 form a reaction chamber 24 in which graphene is deposited on a copper forming sheet 23 which is stretched across the top of a cartridge 22. The cartridges 22 are propelled on a cushion of gas through the reaction chamber 24 and as they progress through the chamber, the copper forming sheets 23 are heated to a range of 900 to 1060 centigrade. In this embodiment, the temperature is approximately 1030 degrees centigrade. The atmosphere above the cartridges is first purged with an oxygen free gas to substantially eliminate the presence of oxygen within the reaction chamber 24. The purge gas is nitrogen. In alternate embodiments, the purge gas may be other gases such as argon. Also, in alternate embodiments the machine 20 may be air cooled or not cooled at all.

Near the middle and end of the reaction chamber 24 reaction gases are introduced to deposit graphene on the copper forming sheet 23. One of the reaction gases supplies carbon atoms to form graphene on the copper forming sheet 23, and it is referred to as the carbon supply gas. In one embodiment, the carbon supply gas is natural gas (methane). In other embodiments, the carbon supply gas could be Acetylene, Butane, Ethane or other carbon based gases. In addition, facilitating gases are introduced to help regulate and facilitate the reaction and in this embodiment, the facilitating gases are Hydrogen, Nitrogen, Helium or Argon.

The cartridges 22 and the copper forming sheets 23 are introduced into the front of the reaction chamber 24, which is the near end as shown in FIGS. 1 and 2. The cartridges 22 move from the front end to the rear end of the reaction chamber 24, and as they enter the chamber 24 a purge gas is introduced through manifolds 26. Each of the sections 61 of the reaction chamber 24 are constructed from quartz. In alternate embodiments fused silica, fused quartz or ceramics may be used. The manifolds 26 apply gases to the top of the reaction chamber 24 and holes are provided below the manifold so that gas escapes from the manifold into the chamber. The purge gases flow toward the front end of the reaction chamber 24. In this embodiment, the first and second sections 61 of the reaction chamber 24 introduce purge gases through the manifolds 26 and the flow is toward the front of the reaction chamber 24. Each of the sections 61 of the reaction chamber 24 is cooled by a jacket of water which is provided by water pipes 28. In the first two sections 61 of the chamber 24, the process of heating the copper forming sheet 23 is begun. Infrared heating tubes are provided inside the chamber 24 above the copper forming sheet 23 and induction heaters are provided below the forming sheet 23 and below the cartridge 22. As the cartridges progress through the reaction chamber 24 the temperature of the copper forming sheet 23 is raised to approximately 1030 before the cartridge 22 reaches the third section. Purge gases are supplied to the third section by the inputs 33 and the mixing manifold 35.

When the cartridges 22 reach the fourth section, the gas mix is changed to create a gas mixture that will deposit graphene on the copper forming sheets 23. Thus, mixing manifold 35 supplies a mixture of reaction gases and facilitating gases to a V-shaped manifold best shown in FIG. 2. The deposition of graphene on the copper forming sheets 23 begins at the point of the V-shaped manifold 39 and progresses outwardly in both directions as the cartridge moves through the reaction chamber 24. The graphene deposited at the point of the V-shaped manifold 39 starts the deposition process and the crystals grow outwardly left and right from the starting point. Likewise, the crystals grow longitudinally along the axis of the reaction chamber as the cartridges move toward the rear of the chamber 24. The V-shape is one example of a way to implement the invention. In alternate embodiments, the manifold could be linear and inclined with respect to the motion of the copper, or linear and perpendicular to the direction of motion. It could also be stair stepped. The cartridges are also intended as a non-limiting example of one embodiment. In alternate embodiments, the copper forming sheet may be transported through the reaction chamber on a continuous copper forming sheet that comes off a roll at one end and is reeled onto a roll on the opposite end of the reaction chamber. Moving structure, such as floating cartridges, rollers or moving belts may be used to support the copper forming sheet as it moves through the reaction chamber in this embodiment.

Figure 3:
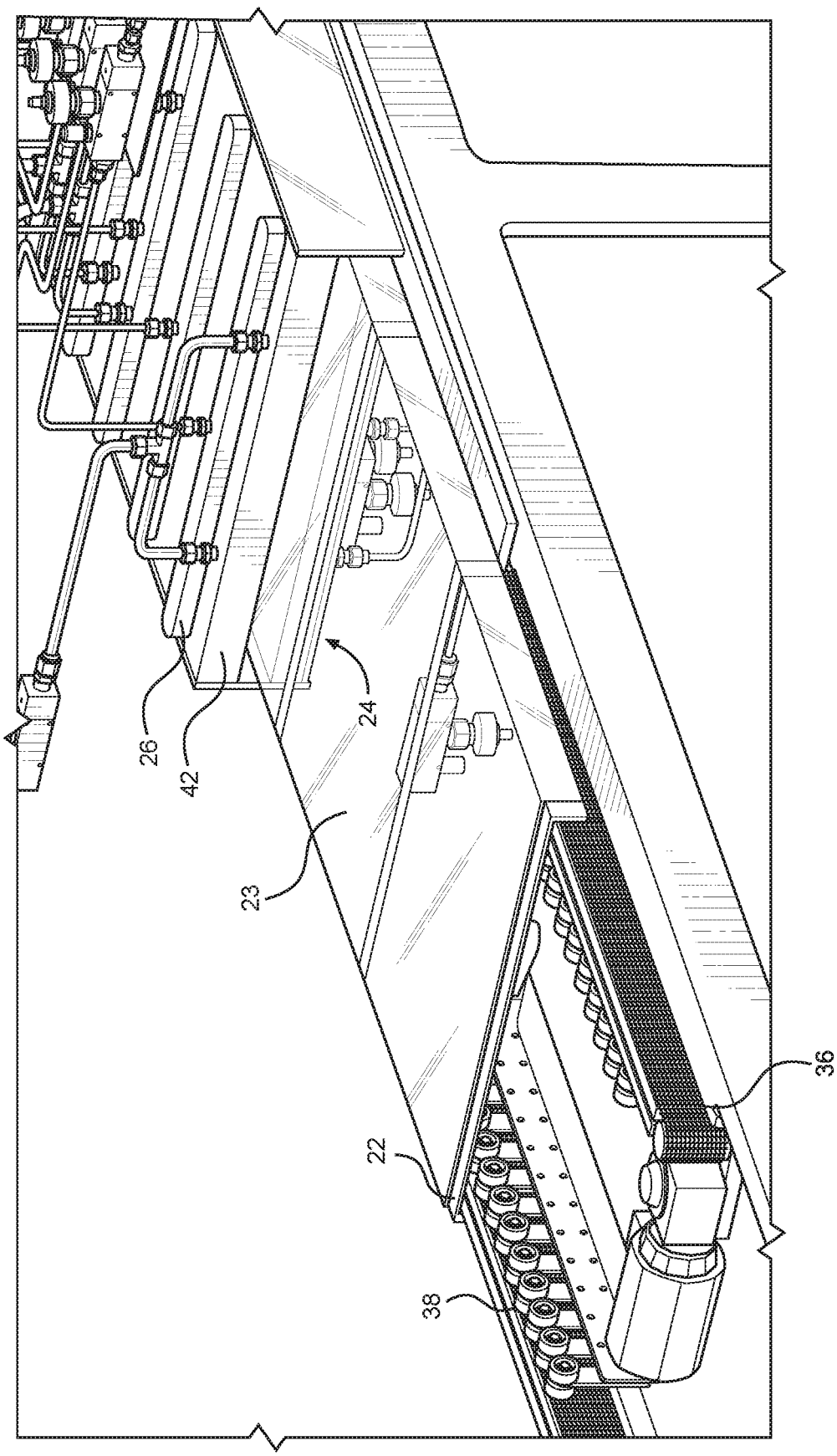
FIG. 3 is a close-up perspective view of the entrance to the furnace.
Figure 4:
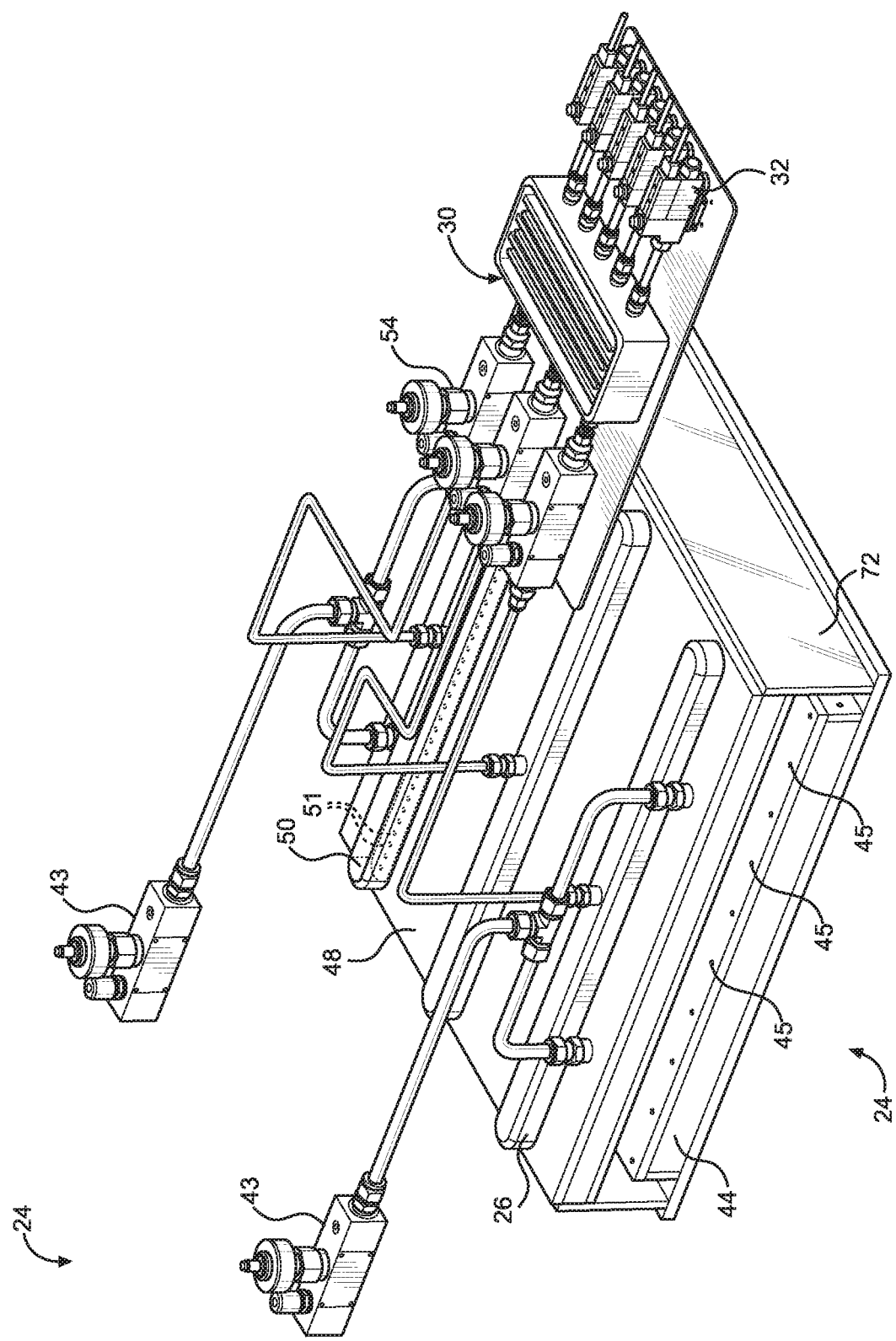
FIG. 4 is a detailed perspective view of one section of the furnace showing the gas delivery system.

A more detailed view of the front end of the machine 20 is shown in FIG. 3. When the cartridges 22 are first loaded into the machine 20, they are initially supported on rollers 38 and they are driven forward into the reaction chamber 24 by belts 36 (or other drive mechanisms) which engage the sides of the cartridges 22. As the cartridges 22 enter the reaction chamber 24 they are supported on a cushion of gas that is supplied by a gas table that extends for the length of the reaction chamber 24. The width of the reaction chamber is the horizontal internal diameter of the furnace 42 in a direction perpendicular to the direction of travel of the sheets 23. The height of the reaction chamber is the vertical distance as shown in FIG. 3 from the sheet 23 to the interior top of the furnace 42. The width is at least 3 times the height but the width is less than 1,000,000 times the height. Preferably, the width is less than 1000 times the height. The configuration of the volume combined with the configuration of the ports and the flow rates of the gases is designed to produce a substantially nonturbulent, laminar flow of the donor gases across the forming sheet 23. The purge gases will also have the nonturbulent laminar flow across the forming sheet which will increase the efficiency with which the purging process takes place. The gas table is best shown in FIG. 4 which shows the entrance of the reaction chamber 24 with the cartridges removed. The gas table 44 includes a plurality of holes in the top of the table through which gas is forced. Since this gas is released into the reaction chamber, it is a gas that is substantially oxygen free. Thus, the gas table 44 floats the cartridges 22 in a manner similar to an air hockey table.

The top of the reaction chamber 24 is formed by a water cooling jacket 48 that is supplied with cooling water by a water input 43 which supplies water to the cooling jacket 48 through water pipes 28. Water is forced through the water cooling jacket 48, drained from the jacket, cooled and recirculated through the water cooling jacket 48 again.

Gas is supplied to the reaction chamber 24 by a gas mixing and control system 32 and a gas mixing manifold 30. In this embodiment, five different gases may be introduced by the control system 32, and the gases are mixed within the manifold 30. A gas mixing monitor receives the mix gas from the manifold 30 and supplies it to the manifolds 50. In this embodiment, each section of the reaction chamber 24 includes three gas mixing manifolds 50 supplied by three different gas mixing monitors 54. The gas mixing manifolds 50 extend through the water cooling jacket 48 and holes 51 are provided in the bottom quartz plate of the water cooling jacket 48. The manifolds 50 isolate the gas from the water in the water cooling jacket 48 and the gas is injected through the holes 51 into the chamber 24. In this embodiment, the holes 51 have a diameter of ½ inch or less, preferably in the range of 0.35 to 0.02 inches. In this embodiment, we use holes that are 0.3 for the reaction gases and 0.1 for the purge gases.

That portion of the reaction chamber 24 shown in FIG. 4 is a section of the reaction chamber 24. The overall chamber 24 is created by providing 11 of these sections 61 connected together and sealed sufficiently that they will contain the purge gases and the reaction gases. Since the reaction chamber 24 is under positive pressure, it is not necessary that the chamber be totally gas tight. To the extent that leaks exist in the chamber 24, the leaking gases will be exhausted from the reaction chamber 24 and recovered by an exhaust hood (not shown) that encompasses the entire reaction chamber and captures escaping gases and heat.

Figure 5:
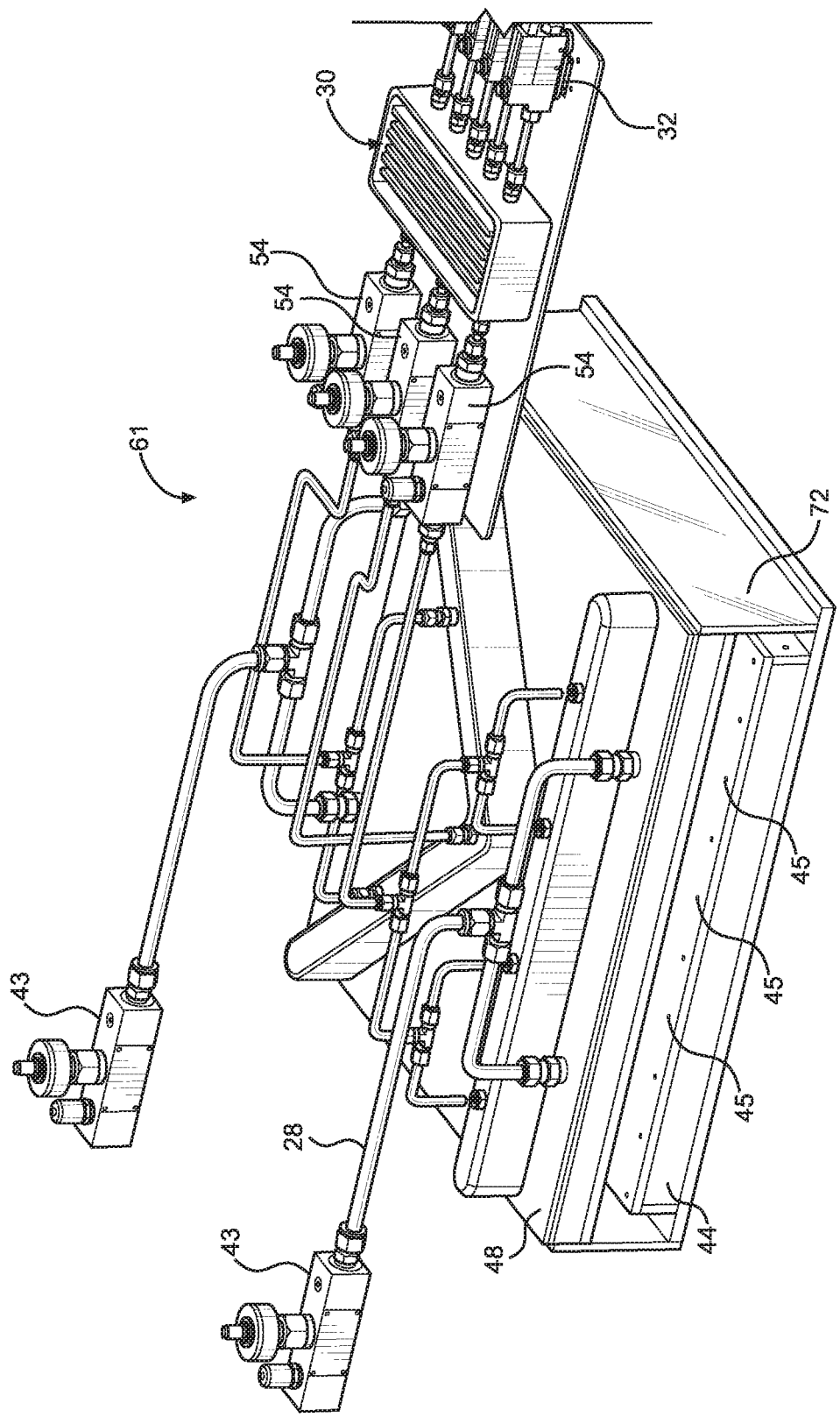
FIG. 5 is another detailed perspective view of one section of the furnace showing a V-shaped gas injection manifold for delivering gas to the furnace.

Referring to FIG. 5, a unique reaction chamber section 61 is shown. It includes a V-shaped gas injection manifold that extends from a point in the center of the reaction chamber 61 and extends rearwardly to the left and right edges of the section 61. Reaction gases are first introduced into the V-shaped gas injection manifold so that graphene production will begin in the center of a copper forming sheet 23. As the copper forming sheet 23 continues to move toward the rear of the reaction chamber 61, the graphene crystal may grow on a longitudinal line parallel to the direction of travel. At the same time, the graphene crystals may begin to grow outwardly laterally toward the left and right lateral edges of the section 61. Thus, the graphene may grow in a V-shaped pattern that will maximize the crystalline size of the graphene. The initial graphene created near the center of the V-shaped manifold 60 will form a crystal structure that may be propagated longitudinally and laterally (left and right) as the copper forming sheet 23 continues to move through the section 61.

In the view of FIG. 5, the gas table 44 and the holes 45 are shown immediately below the water cooling jacket 48. As previously discussed, the cartridges 22 float on the top of the gas table 44, and the copper forming sheet 23 is disposed on the top of the cartridge 22. Thus, the distance between the copper forming sheet 23 and the bottom of the water jacket 48 is approximately 1 or 2 inches to allow enough room for heat lamps. The flows of gases have been acceptably uniform with the 1-inch spacing between the gas holes and the copper forming sheet 23, but as discussed below, a smaller distance, of approximately 0.3 inches, provides improved uniform non-turbulent flow. The separation distance between the copper forming sheet and the bottom of the water jacket 48 is optimized to provide the best uniform gas flow, and provide sufficient clearance to insure no accidental contact between the copper forming sheet 23 and the quartz bottom of the water jacket 48.

Figure 6:
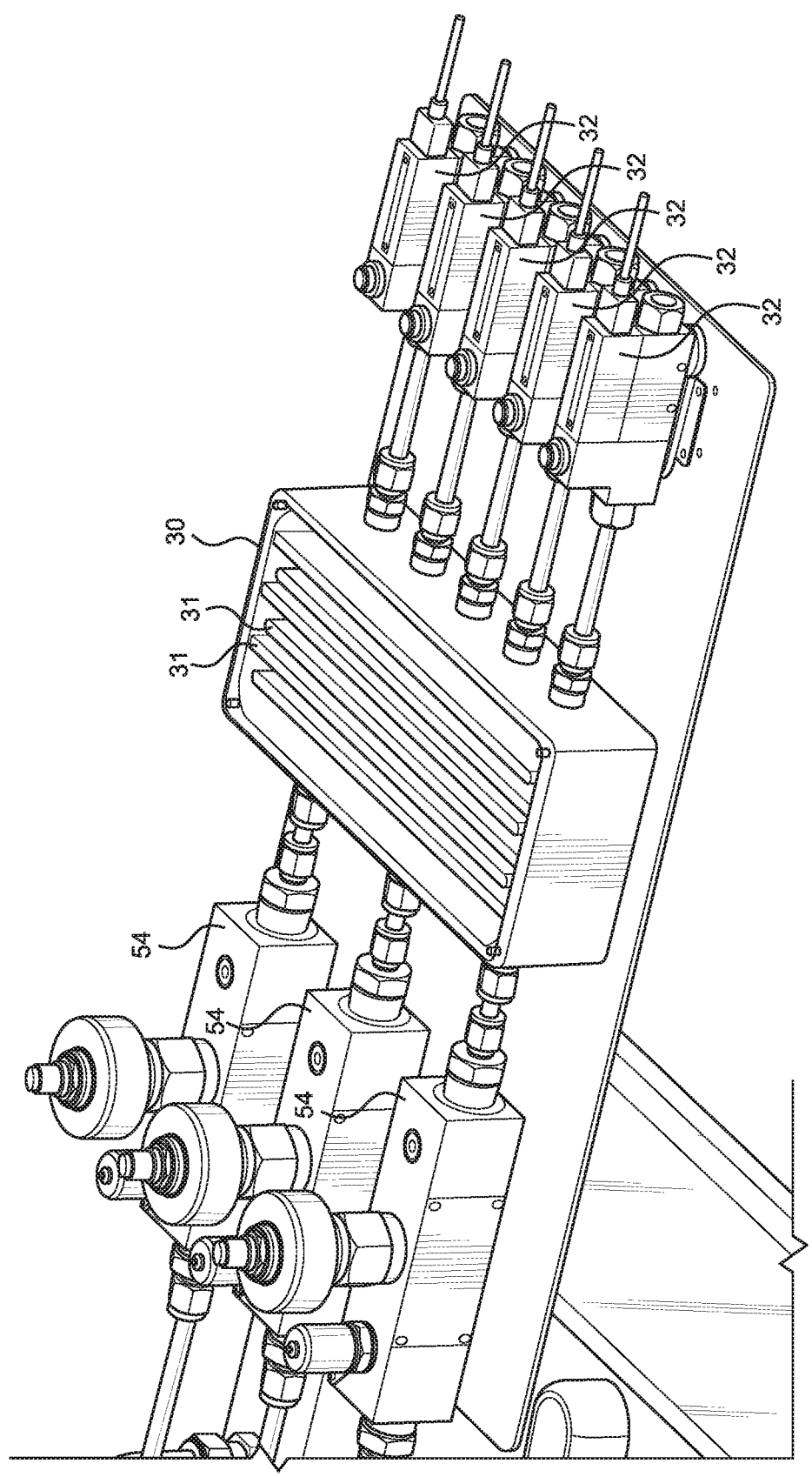
FIG. 6 is a detailed perspective view of a gas mixing system for delivering gas to the furnace.

Referring to FIG. 6, a detailed view of the gas input section 61 is shown. Five gas controllers 32 introduce gas into a mixer manifold 30 which mixes the five gases before transmitting the gases further. A cutaway view of the mixer manifold 30 is shown in FIG. 6 revealing that the manifold 30 includes a plurality of baffles 31 that are designed to thoroughly mix the gases within the manifold. At the beginning of the reaction chamber 24, only inert gases are introduced into the reaction chamber 24. Thus, five inputs and a mixing manifold 30 are not necessarily required at the front end of the chamber 24. However, including the five controllers 32 provides redundancy in case one or more of the controllers fails and also provides flexibility in case different types of inert gases are desired. Likewise, the five controllers 32 provide flexibility and redundancy in the more rearward sections 61 where inert gas, carbon supply gas and facilitating gas is introduced. While five gases are used in this embodiment, other embodiments may use more or fewer gases and other 2D materials may be produced such as Boron Nitride.

Figure 7:
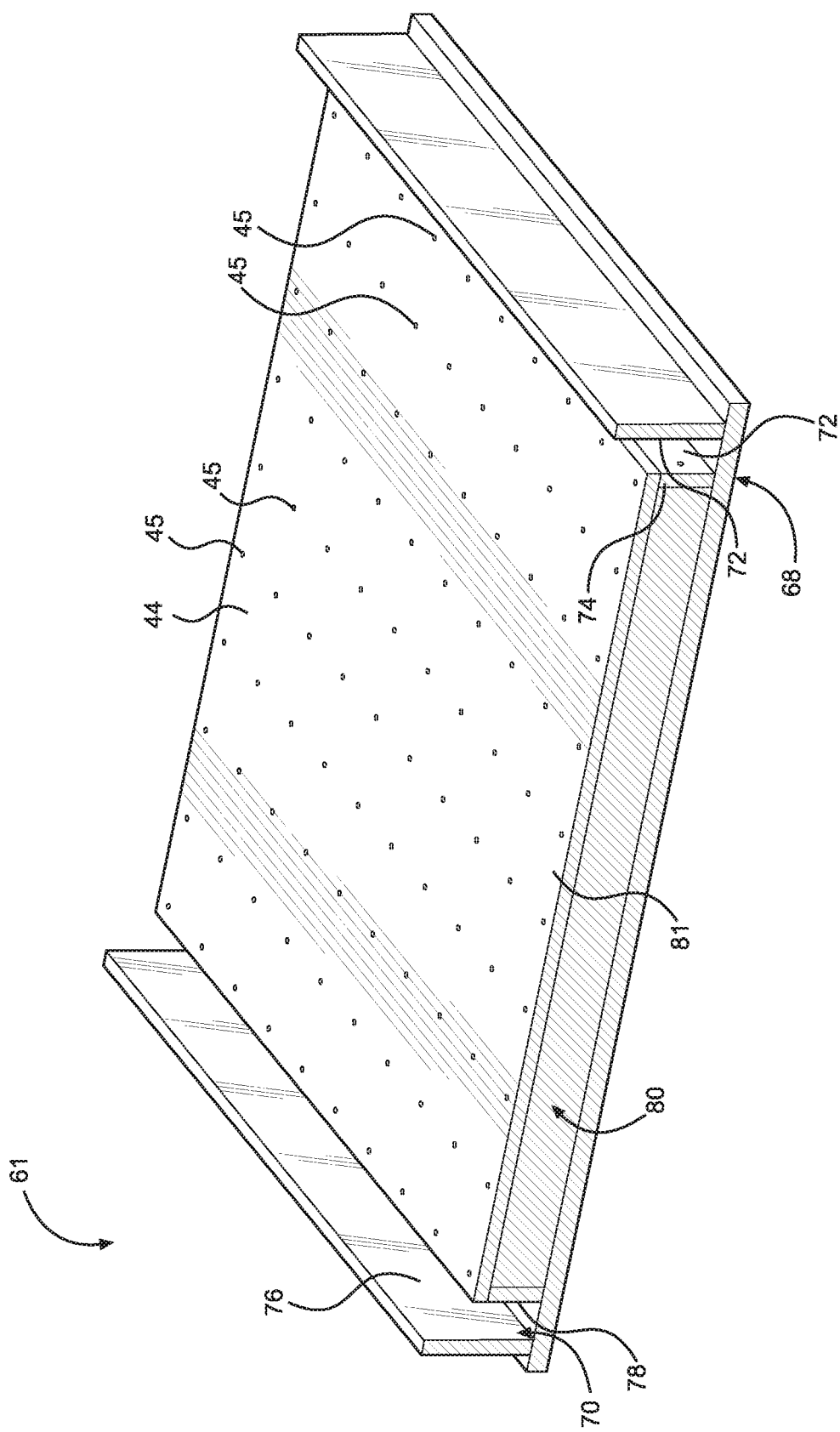
FIG. 7 is an illustration of the float table that functions as a support for the cartridges carrying the forming sheet.

Referring to FIG. 7, a reaction chamber section 61 is shown in a cut away view with the water jacket 48 removed. The section 61 as shown in FIG. 7 is completely constructed of quartz in this embodiment. In alternate embodiments, it may be constructed of other materials including ceramics. Although the various components of the section 61 and the machine 20 are shown as single components, such as single quartz plates, those components may be constructed of multiple components, such a multiple quartz plates, to better contain and control gas flow within the machine 20. The gas table 44 includes a plenum chamber 80 below the top 81 of the table. The plenum chamber 80 is bounded on the left and right sides by table plate 78 and table plate 74. Chamber sidewalls 76 and 72 form the left and right sides of the reaction chamber 24, and return passageways 70 and 68 are formed adjacent to the wall 76 and 72. When a cartridge 22 is placed on the tabletop 81, it wraps around the side table plates 74 and 78, and gas on which the cartridge 22 is floating will escape from underneath the edge of the cartridge 22 along the lower side of the return passageways 68 and 70. This inert gas is exhausted from the reaction chamber 24 through the passageways 68 and 70 and does not significantly escape upwardly towards the tabletop 81. Thus, the inert gases on which the cartridges 22 are floating are not allowed to interfere with the reaction occurring on the top of the cartridge 22.

Figure 8:
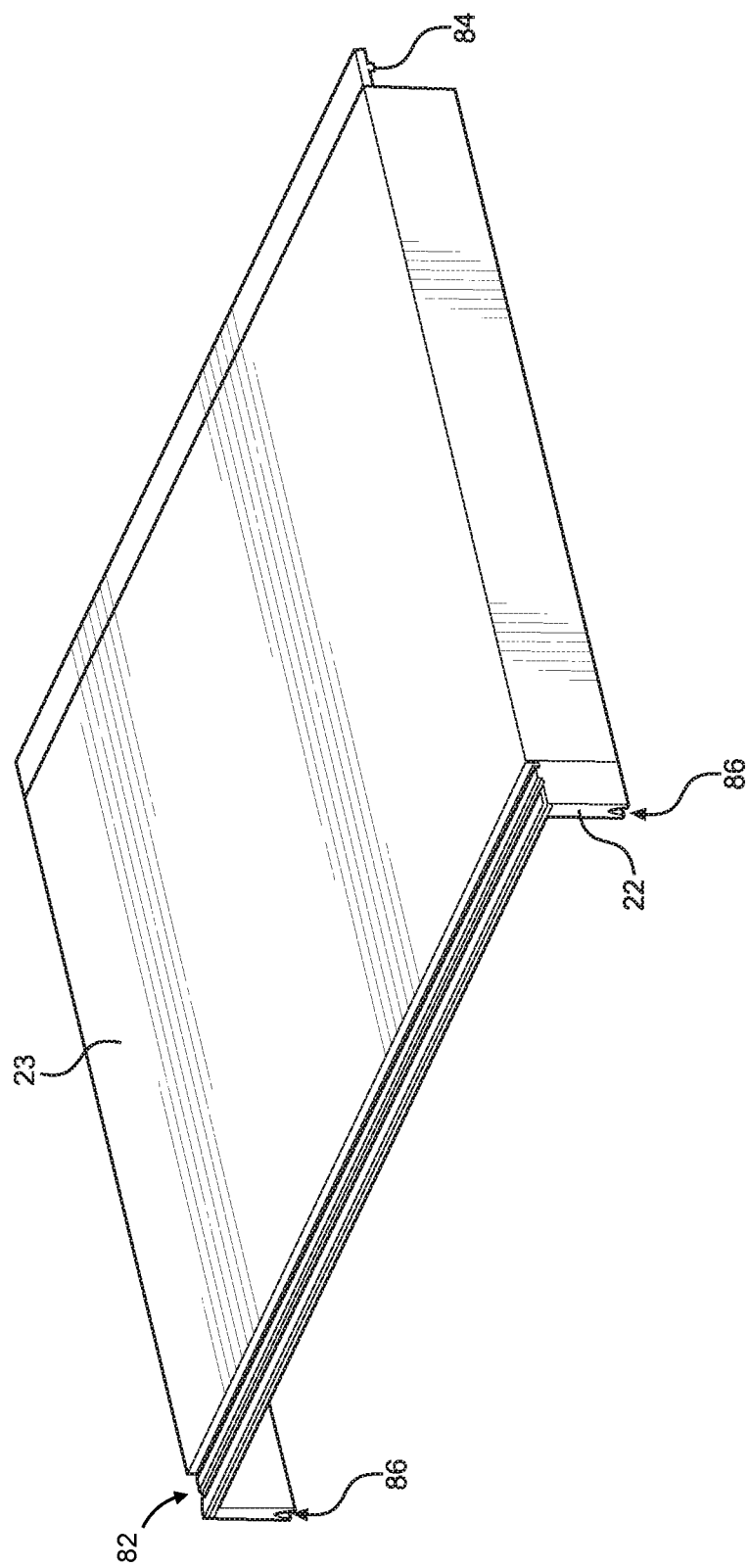
FIG. 8 is a top perspective view of a cartridge.

FIG. 8 shows a detailed view of a cartridge 22 that is completely constructed of quartz in this embodiment. At the rear end of the cartridge 22 a groove 82 is formed for interlocking with another cartridge 22. Likewise, on the forward end of the cartridge 22 an interlocking rib 84 is formed. The front and rear of the cartridge 22 are configured so that the rib 84 fits snugly within the groove 82 and a smooth continuous surface is formed a between the forward and of one cartridge 22 and the rearward end of another cartridge 22. Also, in this view may be appreciated that the copper forming sheet is stretched across the cartridge and bends around the left and right corners of the cartridge. The ends of the copper forming sheet 23 are disposed in V-shaped grooves 86. Then, a locking mechanism is inserted into the grooves 86 to lock the copper forming sheet 23 and place across the cartridge 22. In this embodiment, the copper forming sheet 23 might also be referred to as a copper foil. It has a thickness of approximately 5 to 20 mils. Thinner copper foil is generally better, and in one embodiment the foil is 3 mils in thickness. However, the copper forming sheet 23 may be thicker than 20 mils and may be characterized as a plate.

Figure 9:
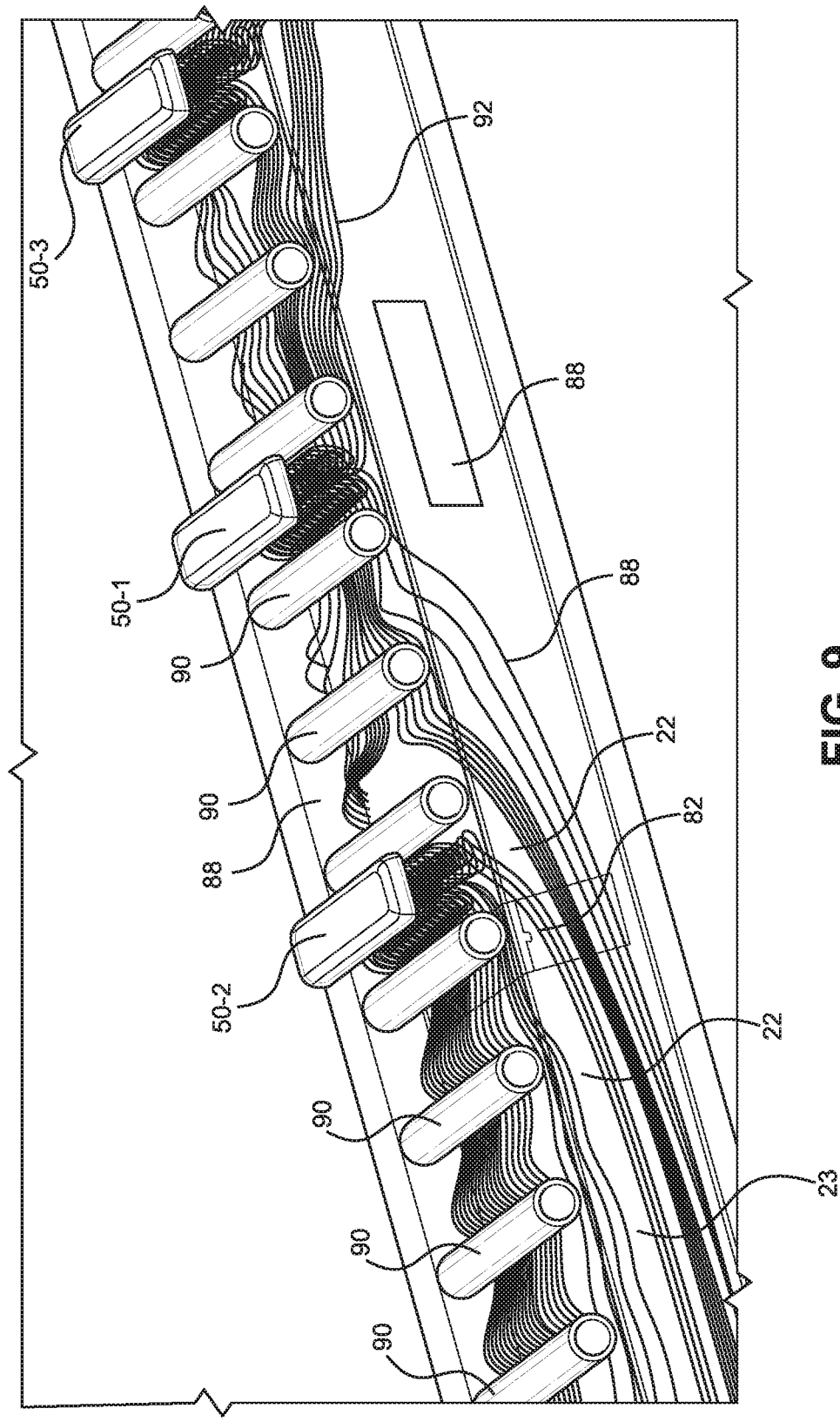
FIG. 9 is a somewhat diagrammatic cut-away section view of gas is flowing within the furnace.
Figure 10:
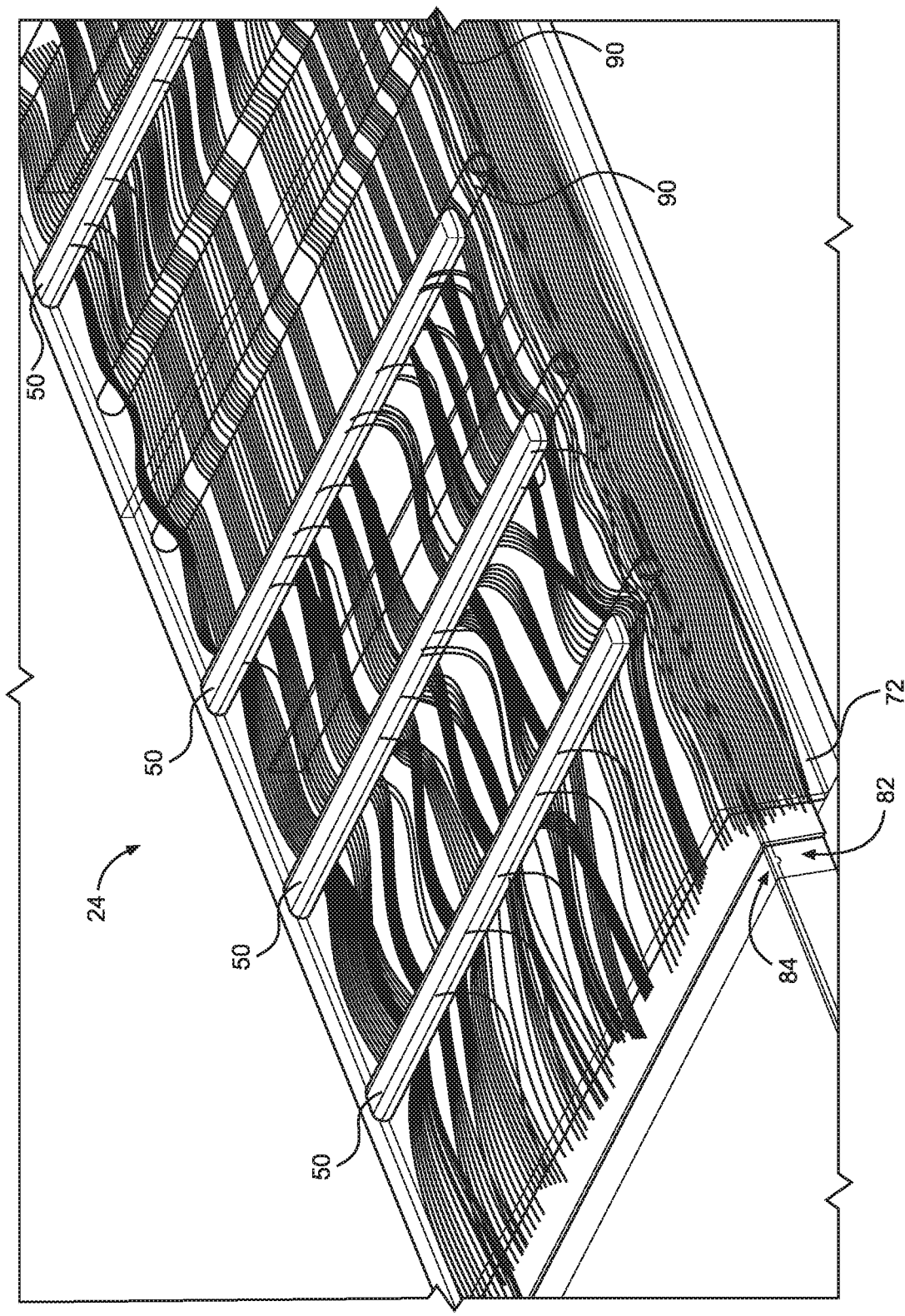
FIG. 10 is a somewhat diagrammatic cut-away section view of gas flowing within the furnace.

FIGS. 9 and 10 show cutaway views of the reaction chamber 24. As shown in these views, a plurality of infrared heating tubes 90 are mounted along the top of the reaction chamber immediately below the cooling jacket 48. A plurality of induction heaters may be mounted in the chamber 24 within plenum chamber 80 formed by the cartridges 22. The induction heaters directly heat the copper forming sheet 23 with magnetic fields that establish eddy currents in the copper forming sheet. Also, the connections between adjoining cartridges 22 is shown with a rib 84 from one cartridge mating with a groove 82 from another cartridge. In alternate embodiments, the induction heaters may be omitted.

Manifolds 50 introduce gas into the reaction chamber 24 with the manifold 50-1 schematically representing the middle or dividing manifold. Gas flowing from manifold 50-1 flows both forwardly and rearwardly, whereas gas flowing from manifold 50-2 flows only in the forward direction and gas flowing from manifold 50-3 flows only in the rearward direction. In this embodiment, reaction gases are introduced only rearwardly from the manifold 50-1 and thus only inert gases flow out of the front of the reaction chamber 24. Referring to flow lines 88 and 92, it will be appreciated that the gas pressure created by manifolds 50 in the top of the reaction chamber 24 exceeds the gas pressure created by the gas table 44. Thus, the gases from the top of the reaction chamber 24 flow downwardly into the passages 68 and 70 as well as rearwardly and forwardly through the reaction chamber 24.

Figure 11:
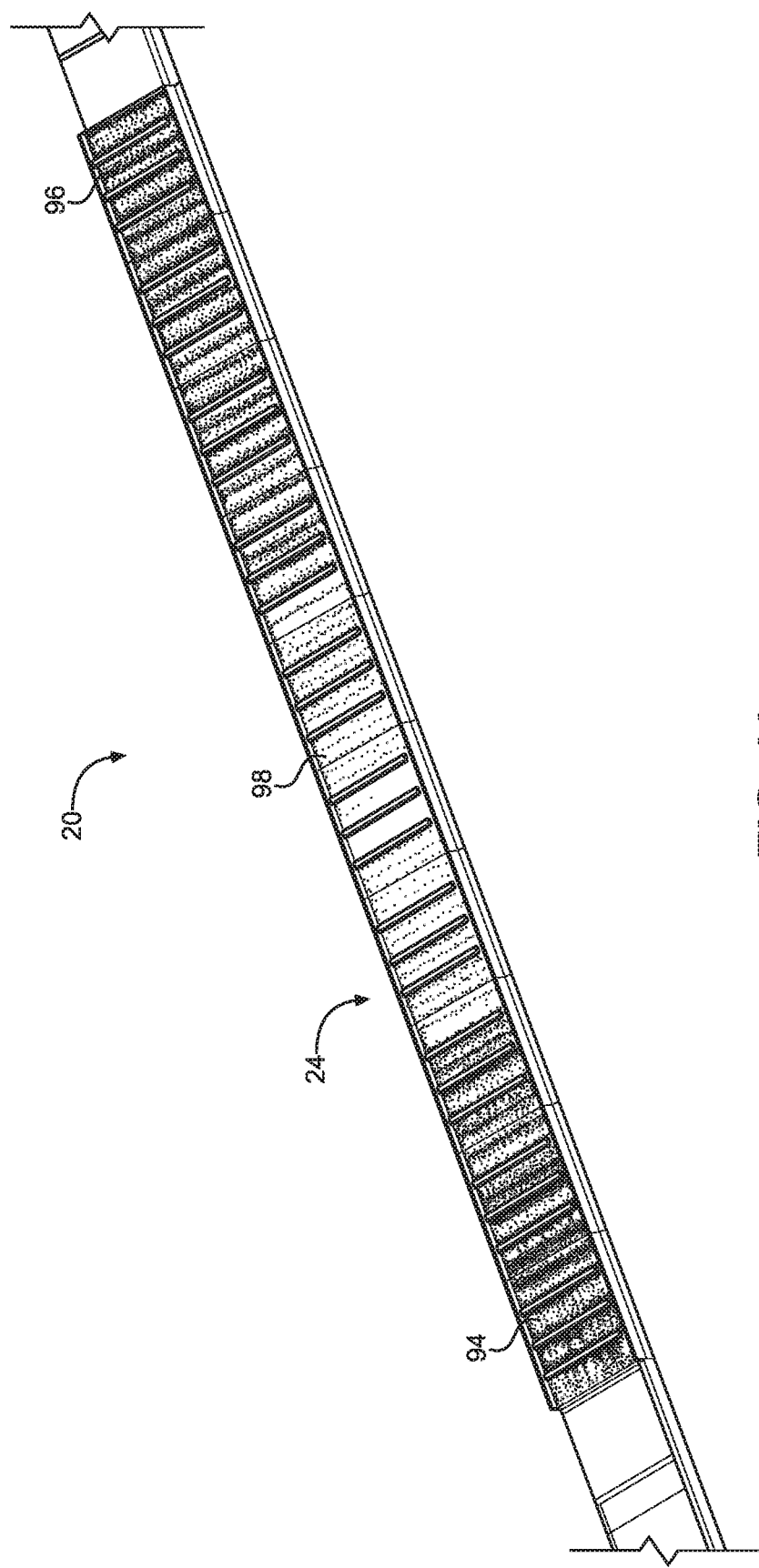
FIG. 11 is an illustration of flow within the furnace showing gas flowing out the entrance and the exit of the furnace.

FIG. 11 illustrates the entire length of the reaction chamber 24 and shows the flow gradient within the chamber 24. The light-colored flow lines 94 represent forward flow toward the front of the reaction chamber 24 whereas the darker flowlines 96 represent a rearward flow toward the rear of the reaction chamber 24. The gray or medium flowlines 98 in the middle of the reaction chamber 24 represent slow flow rates. Thus, it may be appreciated that the flow basically starts near the middle of the chamber 24 and flows forwardly and rearwardly from the middle.

To begin operation of the graphene manufacturing machine 20, blank cartridges 22 without the copper forming sheets 23 attached are loaded into the machine 20 from one end to the other. The machine 20 is then preheated and sensors are disposed along the length of the machine measure the temperature of the gas within the reaction chamber and the temperature of the top of the cartridges. For example, in the embodiment of FIGS. 12-15, the sensors are mounted in the bottom of the gas feed quartz plates 120 and the sensors may monitor both gas temperature and the surface temperature of the cartridges based on radiant heat from the cartridges. When the temperature of the top of each cartridge in the third section from the front to the rear section of the machine have reached operating temperature, approximately 1030 degree centigrade, the gases are turned on. Alternatively, the purge gases may be turned on before the heating process has begun or during the heating process. Typically, the donor gases and the facilitating gases would be turned on only after the operating temperature has been reached, but it would also be possible to begin introducing donor and facilitating gases even before operating temperatures are reached. The purge gases that are exiting the front of the machine 20 are collected by a hood system and are tested to ensure that the purge gases are substantially oxygen free. The gases exiting the rear of the machine are likewise collected by a separate hood system (or the same hood system) and are tested to ensure that the gases have the proper mixture of inert gas, facilitating gas and carbon supply gas (donor gas).

Once it is determined that the gases are proper and that the operating temperatures have been achieved, the first cartridge 22 loaded with a copper forming sheet 23 is introduced into the front end of the reaction chamber 24. The belts 36 drive each cartridge into the reaction chamber 24 and each cartridge 22 pushes the cartridge 22 in front of it. Thus, the belts 36 push the entire train of cartridges 22 through the machine 20. The cartridges 22 are pushed through the machine 20 as quickly as possible and the speed is determined in part by the length of the machine. A longer machine with more sections 61 is capable of operating at a faster cartridge speed. In general, the speed at which the cartridges may travel through the machine is determined by the length of the machine that is depositing carbon onto the copper forming sheet 23. For example, if that length is 10 feet and it is desired to expose the cartridges to the carbon supply gas for 10 seconds, then the cartridges may travel at a maximum speed of 1 ft./s through the machine. If that length is 20 feet and again it is desired to expose the cartridge 22 to the carbon supply gas for 10 seconds, then the cartridges may travel at a maximum speed of 2 ft./s through the machine.

When the cartridges 22 exit the rear end of the machine, they are transported to a processing area and the copper forming sheet 23 is removed from the cartridge 22 and another copper forming sheet 23 is mounted on the cartridge 22. Then, the cartridge with the new copper forming sheet 23 is returned to the front of the machine and is again cycled through the machine to create another copper forming sheet 23 with graphene deposited thereon.

The graphene is removed from the copper forming sheet 23 by a method that is dependent upon the desired use and condition of the graphene. To maintain the maximum integrity of the graphene, the copper forming sheet 23 may be removed by substantially completely dissolving the copper forming sheet 23 in a bath of nitric or sulfuric or sulfurous or similar acid. To begin that process, an adhesive polymer forming sheet is first applied to the graphene on the copper forming sheet 23. Then, the copper forming sheet 23 is dissolved in the acid and the polymer forming sheet is used to handle the graphene and maintain the integrity of the graphene during further processing. For example, it will normally be necessary to remove the acid from the graphene by flooding the graphene and the polymer forming sheet with water and an isotonic solution.

The graphene may also be removed by a peeling process whereby again a polymer forming sheet is adhesively secured to the graphene. Then, a jet of fluid is applied to the intersection of the graphene and the copper forming sheet 23 to gently release the graphene from the copper forming sheet 23. In one embodiment, the jet of fluid may be a copper acid that partially dissolves the copper immediately adjacent to the graphene and causes the graphene to be released from the partially dissolved copper. In this embodiment, an array of microjets and microfluidic pumps may be used to simultaneously begin the release of the graphene along the entire line or array. For example, the array of microjets may extend across the width of the copper forming sheet 23 so that the graphene is peeled as a single film from the copper forming sheet 23. Again, the polymer forming sheet provides a substrate for the graphene to protect the graphene and allow it to be handled more easily.

In this particular embodiment, each cartridge has a longitudinal length that is smaller than its width. The longitudinal length is parallel to the direction of movement through the machine, and the width is perpendicular to the direction of movement. Preferably, the cartridge 22 has a length of approximately 2 feet and a width of approximately 4 feet. Thus, the copper forming sheet 23 applied to the cartridge 22 will also have a length of approximately 2 feet and a width of approximately 4'10". The additional 10 inches is desirable to allow the copper forming sheet 23 to wrap around the cartridge 22 and fit into the clamping groove 87 on the underside of the cartridge 22. Thus, in this embodiment each cartridge 22 may produce a graphene forming sheet having maximum dimensions of approximately 2'×4'. However, depending upon the process for removing the graphene from the copper forming sheet 23, it may be desirable to remove sections 61 of the graphene from the copper forming sheet 23, and it may be desirable to cut the copper 23 forming sheet into sections 61 before removing the graphene.

Figure 12:
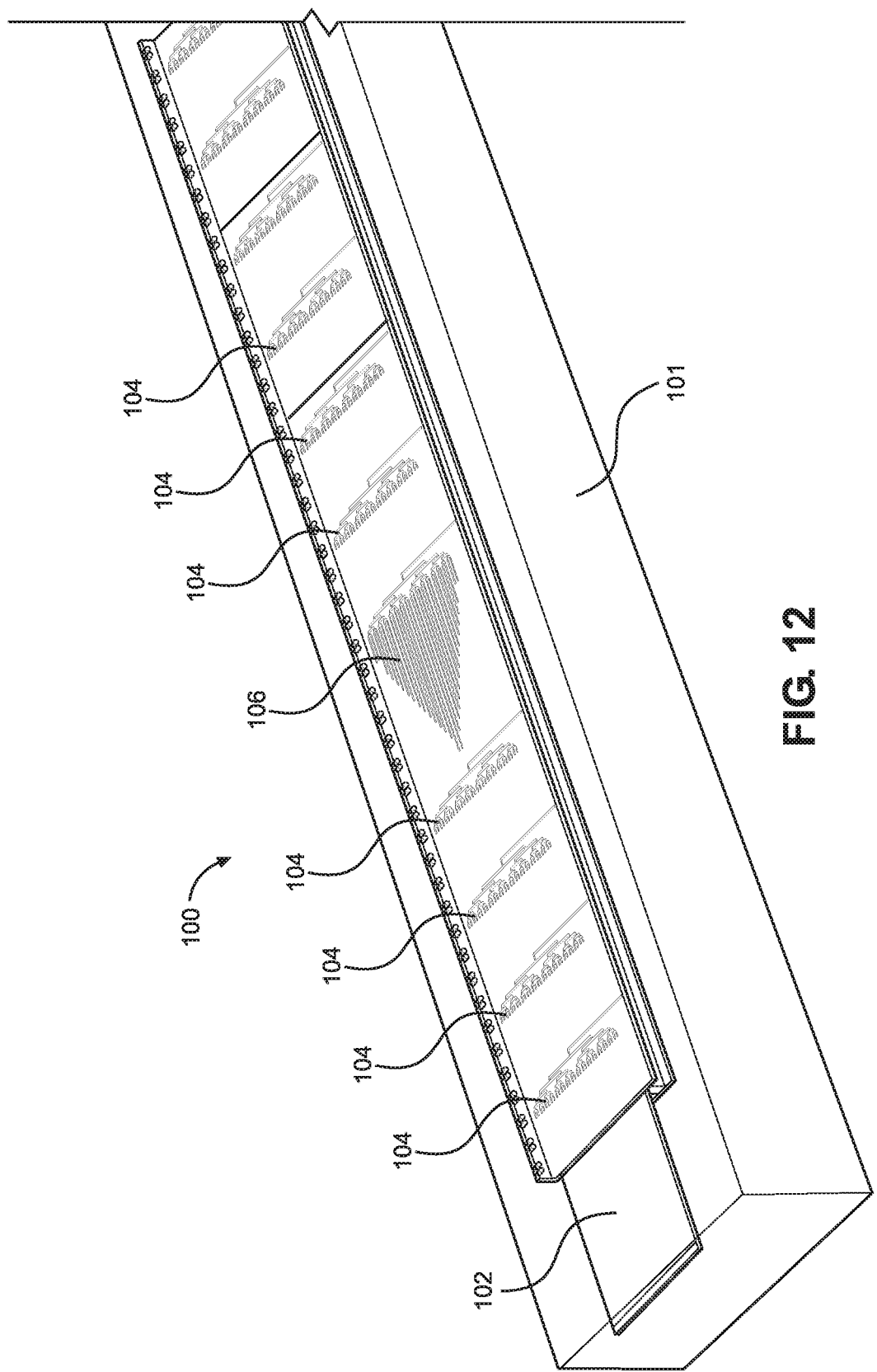
FIG. 12 is an illustration of multiple patterns of gas ports integrated into quartz plates with one of the patterns being V-shaped and the remainder being linear.

Referring now to FIG. 12 a large-scale graphene machine 100 is shown constituting another embodiment. A hood system 101 is schematically represented, and it collects and retains gas that escapes the machine 100 to provide a desired atmosphere or environment around the machine 100. The machine 100 is similar to the machine described above except that it distributes gas to the reaction chamber through integrated gas circuits 104 and 106. The integrated gas circuits are etched into a substrate such as quartz and the etched gas circuits are covered with a thin plate which may also be quartz. Laser etching may be used to etch the gas circuits 104 and 106 into the substrate. The materials of the integrated gas circuits 104 and 106 are selected to be transparent or nearly transparent to infrared heat. More specifically, the material is chosen to be as transparent as possible to near infrared heat having a wavelength of between 0.6 µm and 2 µm. Quartz is an ideal material for the substrate because it is practically transparent to near infrared heat.

Two different types of integrated gas circuits may be used. The gas circuit 104 is a linear circuit meaning that it discharges gas through holes that are positioned in a line. Preferably, the line is perpendicular to the travel direction of the cartridge 102. The gas circuit 106 is a V-shaped circuit meaning that the discharge holes are positioned in a V and distribute the gas onto the cartridge 102 within the reaction chamber in a V-shape which is similar to the V-shape of the V-shaped manifold 60 described above.

The cartridge 102 is similar to or identical to the cartridges described above. In this particular embodiment it is preferred to use a cartridge having the dimensions of 2'×2', but smaller or larger cartridges could be used. As shown in FIG. 12, the reaction chamber 24 is immediately below the integrated gas circuits 104 and 106. Thus, the gas is released from the gas circuits 104 and 106 at a distance that is very near the top surface of the cartridge 102. For example, the distance between the bottom of the holes releasing the gas in the top surface of cartridge 102 may be about ¼ inch, and a spacing of ⅛ inch is desirable if the tolerances of the machine components will allow such spacing. One advantage of releasing the gas in close proximity to the top surface of the cartridge 102 is the creation of a very smooth laminar flow of gas in both the forward and reverse directions. In addition, the machine 100 does not include heaters in the reaction chamber 24. The heaters are disposed above the integrated gas circuits 104 and 106, and are preferably near infrared heat sources. Thus, the heat is transmitted directly through the integrated circuits 104 and 106 onto the cartridges 102 and no heaters are disposed in the reaction chamber 24. If desired, induction heaters may also be used in the manner described with respect to the prior embodiments, but the near infrared heaters alone are sufficient for most applications.

Figure 13:
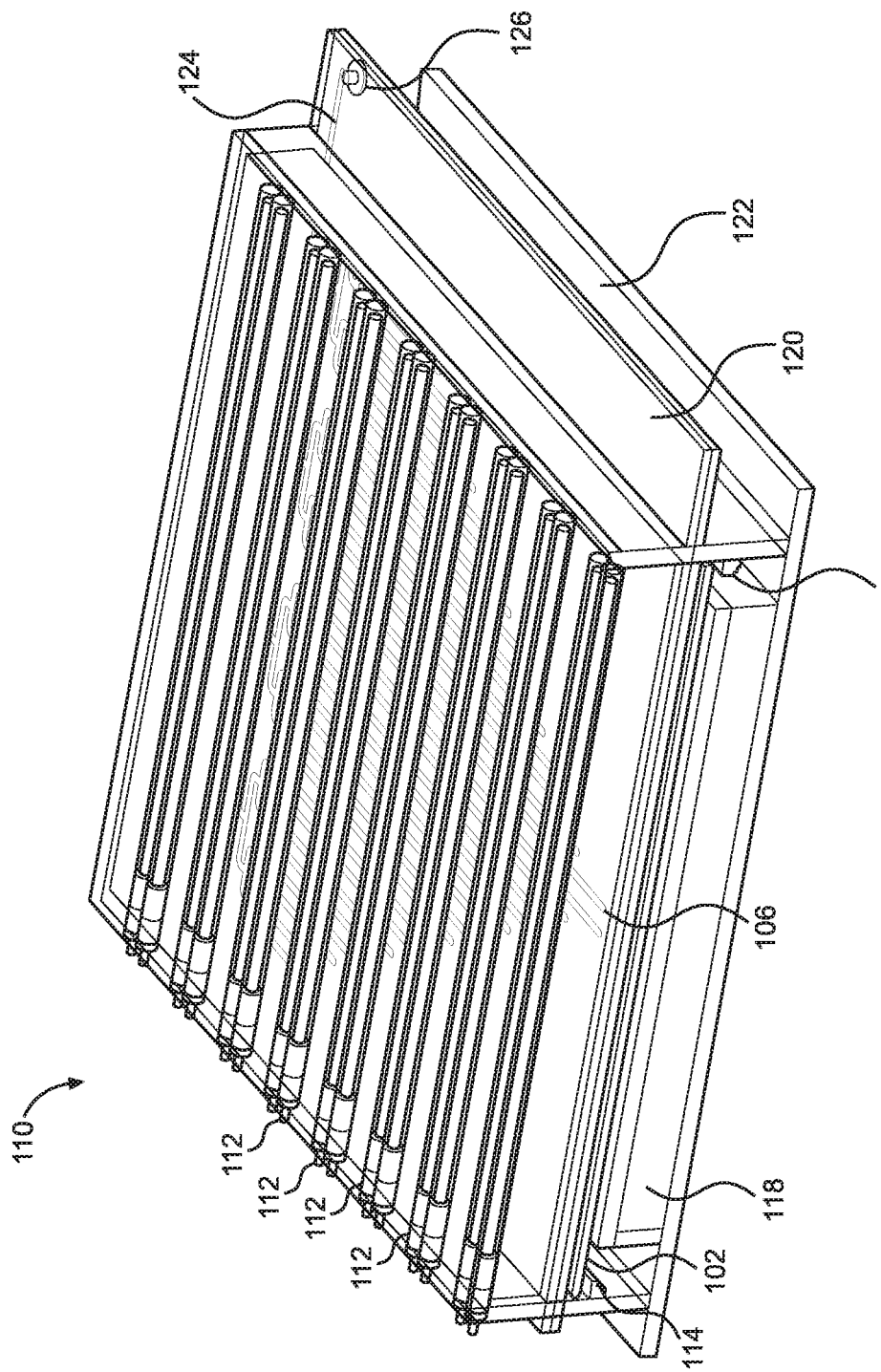
FIG. 13 is a perspective somewhat diagrammatic view of a furnace section showing that the heaters are above the gas ports and that the gas boards are above the reaction chamber.

A configuration of heaters is shown in FIG. 13 in which a heater box 110 is mounted directly above a gas circuit 106. In this view, the top of the heater box 110 is shown to be semitransparent so that a plurality of near infrared heater lamps 112 may be seen within the heater box 110. The top is usually opaque to visible light. The lamps 112 are parallel tubes extending across the width of the gas circuit 106 in a direction perpendicular to the movement of cartridges 102 through the machine. In this configuration, the lamps 112 transmit a uniform heat pattern through the integrated gas circuit 106 and onto the cartridge 102. The cartridge is pushed through the reaction chamber 24 on a float table 118 in a manner similar to that described with respect to previous embodiments. In this embodiment, ledges 114 and 116 are provided immediately below the outer edges of the cartridge 102 and are positioned so that there is a very small space between the ledges 114 and 116 and the cartridge 102. The purpose of the ledges is not to support the cartridge and thus it is preferable that the ledges 114 and 116 do not touch the cartridge 102. The purpose of the ledges is to prevent flow of gas in an upward direction from beneath the cartridge 102 upwardly into the reaction chamber 24. The small spacing between the ledges 114 and 116 and the cartridge 102 will prevent any significant flow of gas upwardly or downwardly around the edges of the cartridge 102. However, in alternate embodiments, the cartridges may rest on the ledges 114 and 116 and the cartridges may slide on the ledges on a quartz-to-quartz interface. In such embodiment, the float tables 118 may be eliminated if desired.

In the view of FIG. 13 it may be appreciated that the spacing between the gas circuit 106 and the cartridge 102 in the reaction chamber 24 is very small, on the order of ¼ inch, and ⅛ inch is desirable. The quartz plates 120 that form the gas circuit 106 extend outwardly from the right side of the reaction chamber 24 in the right side of the heat box 110 for a distance of about 3 inches. One purpose of this extension is to provide access to the gas circuit 106. A supply line 124 is formed in the plates 120 and extends outwardly along the extension to a connector 126 formed in the bottom of the plates 120. A gas supply may be connected to the connector 126 and gas may be introduced through the supply line 124 to the gas circuit 106.

Figure 14:
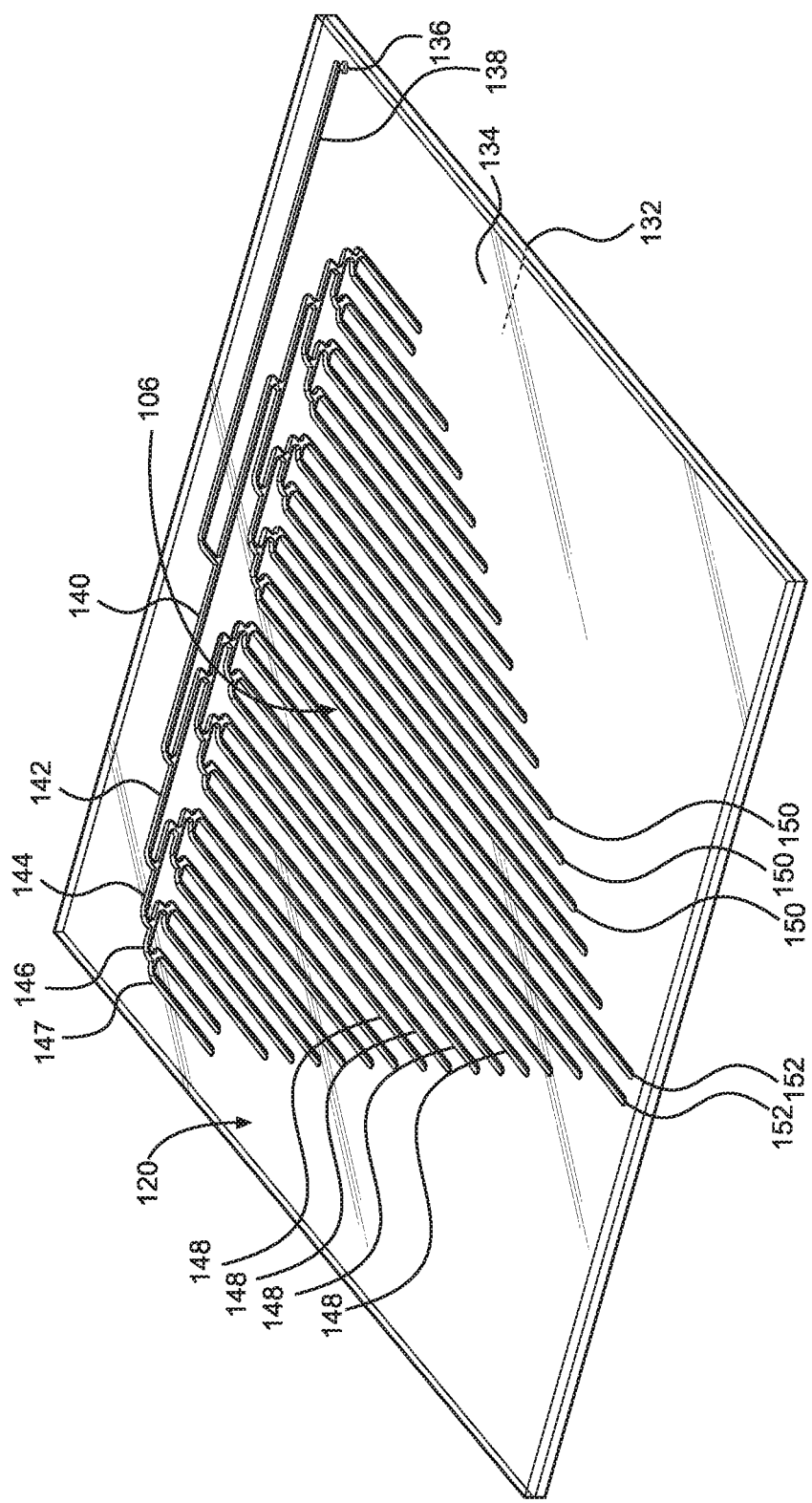
FIG. 14 is a perspective illustration of two quartz plates in which gas passageways and gas ports have been formed.

A detailed view of the two quartz plates 120 is shown in FIG. 14. A base plate 132 has a thickness of about 0.25 inches and an upper plate 134 is positioned over the base plate. The gas circuit 106 is etched into the base plate 132 and in this particular gas circuit, the channels forming the gas circuit 106 are approximately 0.3 inches wide and approximately 0.15 inches deep. Gas is supplied through a connector 136 into a supply line 138. The supply line connects through a plurality of branch lines and 140, 142, 144, 146 and 147 to a plurality of distribution lines 148. A plurality of holes 150 are formed in the base plate 132 extending from the ends of the distribution lines 148 to the bottom of the base plate 132. The holes 150 constitute nozzles having a diameter of approximately 0.30 inches that feed gas into the reaction chamber below the plate 132. The holes 150 are disposed in a V-shape that points into or against the direction of travel of the cartridges as they move through the machine. In this particular embodiment, the V-shaped of the holes 150 terminates at a double point formed by two holes 152 that are aligned with each other along a line perpendicular to the direction of travel of the cartridges. In this particular embodiment, the two holes 152 constitute the point of the V-shape. As discussed above with regard to the V-shaped manifold, the purpose of the V-shaped is to promote the formation of a single large crystal beginning at the point of the V-shaped and growing as the cartridge moves further along its path beneath the integrated gas circuit 106.

Figure 15:
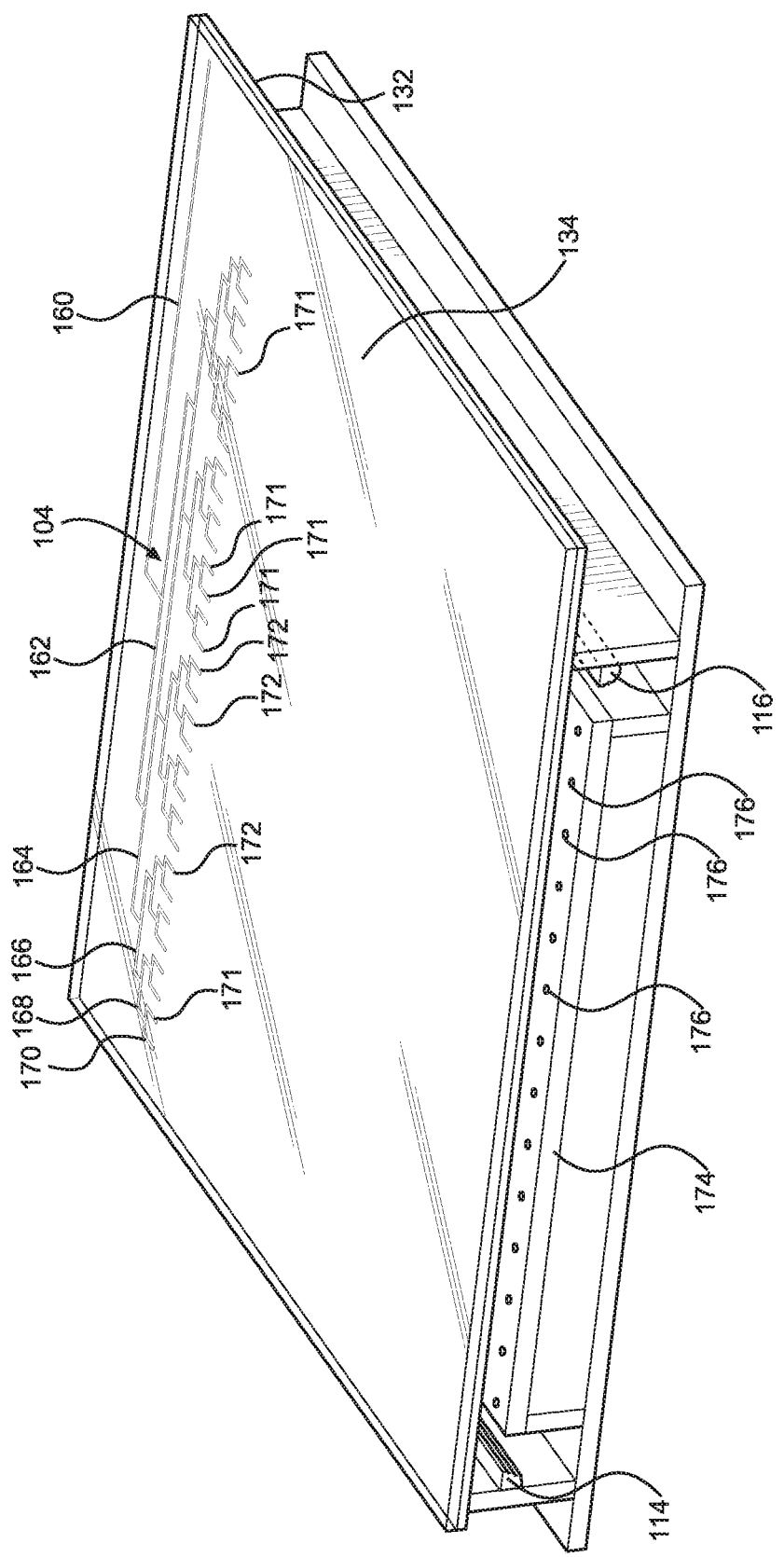
FIG. 15 is another illustration of a section of the furnace showing the integrated gas passageways and ports formed in two quartz plates.

The linear integrated gas circuit 104 is illustrated in FIG. 15. Again, the gas circuit 104 is formed by a baseplate 132 and the top plate 134. Preferably the gas circuit 104 is etched into the base plate in the top plate is sealed on top of the baseplate 132 to seal the top portion of the gas circuit 104. The linear gas circuit 104 includes a supply line 160 that feeds branch lines 162, 164, 166, 168 and 170. A plurality of distribution lines 171 are connected between the branch lines 170 and a plurality of nozzles 172 that are formed through the baseplate 132. The nozzles 172 are preferably simple holes that extend through the baseplate to admit gas into the reaction chamber 24. The nozzles 172 are preferably smaller than the nozzles used in the V-shaped gas circuit 106. Thus, the nozzles 172 preferably have a diameter of approximately 0.1 inches. The channels forming the branch lines and distribution lines have a width of approximately 0.1 inches and in depth of approximately 0.15 inches. The dimensions of the branch lines, distribution lines and nozzles (holes) are chosen to be sufficiently small to ensure uniform laminar flow through the gas circuit to ensure uniform injection of gas into the reaction chamber. The linear gas circuit 104 is constructed such that the overall length or distance from each nozzle 172 to the supply line 160 is the same. Thus, the pressure drop from the supply line 160 to each nozzle 172 should be the same.

In this view, the float table 174 is shown below the plates 132 and 134, but the cartridge has been removed. In this section the ledges 114 and 116 are provided in the same position and for the same purpose as previously described. The flow tables emit an inert gas through the holes 176 to float the cartridges as they pass through the machine and the ledges 114 and 116 substantially eliminate any gas flow into or out of the reaction chamber around the edges of the cartridge.

The two hole patterns described above are examples and other types of patterns for the gas a meeting nozzles may be used. In addition, other types and shapes of gas circuits may be used. For example, the V-shaped gas circuit may be formed by two linear gas circuits each of which starts in the center of the substrate (quartz plate) and extends rearwardly at an angle of +45° and −45° with respect to the direction of movement of the cartridge beneath the integrated gas circuit. Likewise, a single linear gas circuit may start at one edge of the substrate and extend to the opposite edge of the substrate and extend rearwardly at an angle of approximately 45° with respect to the direction of the movement of the cartridge. The purpose of the V-shaped and the inclined shape is to start the formation of graphene crystals at a substantially single position so that the crystal structure can grow from a single position and thereby produce larger crystals.

In this particular embodiment of FIGS. 12-15 the flow of gases is particularly easy to control and is uniform, smooth and laminar. To begin the flow of gases within the machine, inert gases may be used throughout the entire machine. The inert gases will purge the machine and will establish desired flow patterns. Once these flow patterns have been established they will continue unchanged absent disturbances. Thus, the flow patterns may be established with inert gases and then the reaction gases may be introduced at a later time after the flow pattern has been established.

The cartridges used in all embodiments may be constructed in different manners depending on the type of production desired. For example, if a machine is to be used only with near infrared heat lamps, the copper films as described in the first embodiment above provide a suitable receptor for the graphene. However, if it is desired to use induction heaters, the cartridge 102 may be constructed with a tungsten layer beneath the copper. Tungsten and copper repel each other chemically and resist bonding one to the other. Thus, tungsten is a desirable material for use as the first layer on the top of the cartridge 102. Even at high temperatures the copper film will not bond or adhere to the tungsten layer. Also, the tungsten layer is electrically highly resistive and is a good material for use in inductive heating. Because of its high resistance it is unlikely to develop eddy currents and hotspots and it rapidly transmits heat to the adjacent copper. Thus, the tungsten will aid in the uniform heating of the copper.

To minimize heat requirements, the tungsten and copper layers on the cartridge 102 may be made as thin as possible. For example, it may be desirable to sputter, metalize or otherwise apply a thin layer of tungsten onto the cartridge 102 and then heat the cartridge and tungsten to anneal the tungsten and create a smooth surface for supporting the copper layer. The copper layer may be a self-supporting film that is physically applied to the tungsten layer, or the copper layer may be applied to the tungsten layer by metallizing techniques such as sputtering, vacuum metallizing, thermal spraying, cold spraying or other metallizing techniques. After the graphene layer has been deposited on the copper layer, the process may be repeated. That is, the cartridge may be reused and copper or another suitable material may be applied on top of the graphene layer. Then, the cartridges reintroduced into the reaction chamber and the process is repeated to apply another layer of graphene on top of the new layer of copper or other suitable material. This process may be repeated a number of times as desired to produce a multilayered structure of graphene layers and metallic layers. Alternatively, the graphene layers in the metallic layers may be separated in the graphene recovered for applications requiring only graphene.

Figure 16:
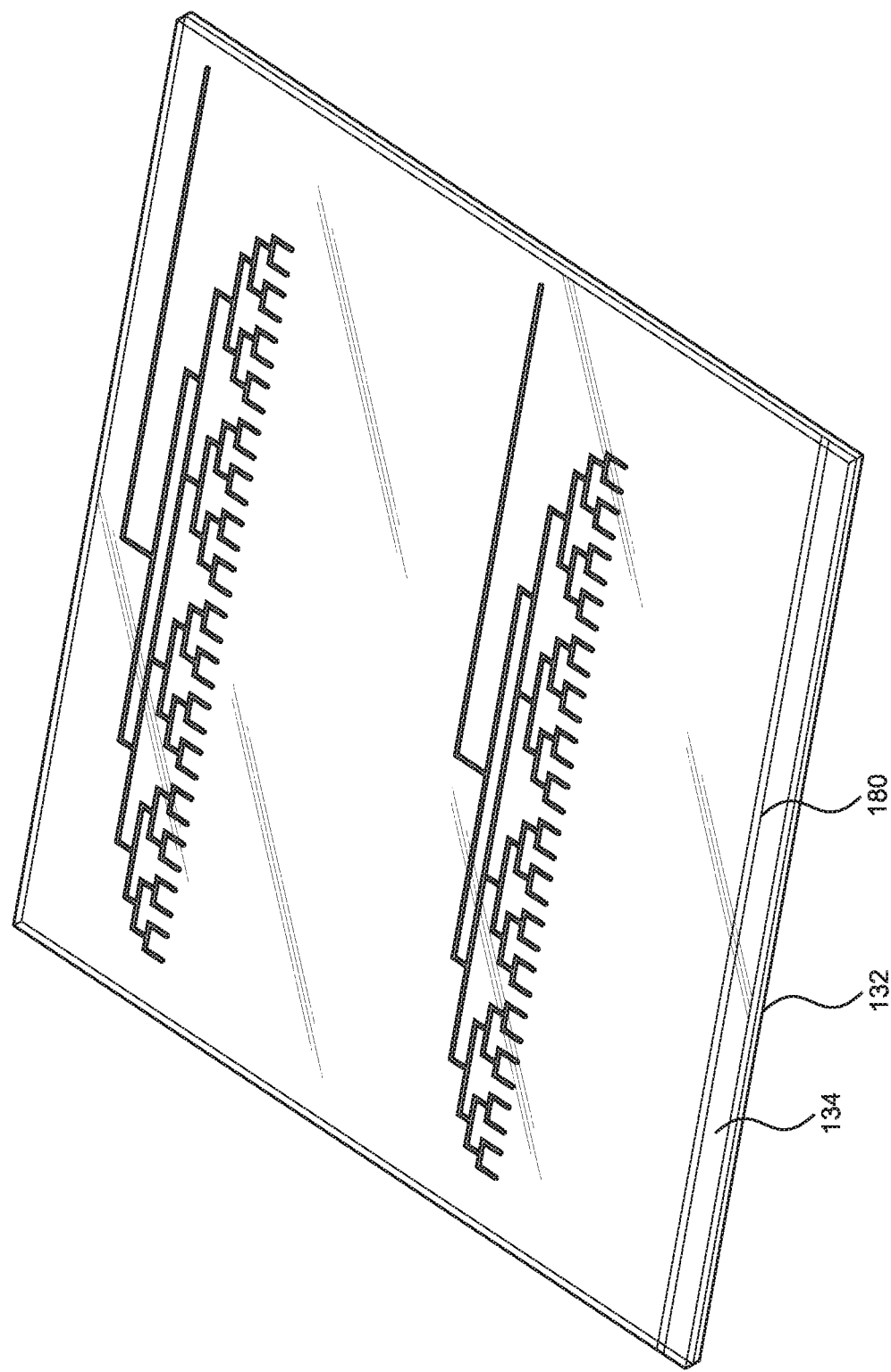
FIG. 16 is and illustration of gas passageways and ports formed into a pair of patterns formed by two quartz plates.

Referring to FIG. 16, the quartz plates 134 and 132 may also be used to incorporate a groove in which to mount sensors for monitoring the temperature of the copper in the combustion chamber below the quartz plate 132. A wide variety of sensors may be mounted in the groove 180 that is preferably etched into the quartz plate 132, but it may also be machined or otherwise formed. A preferred sensor would be a radiant heat sensor that is focused downwardly looking through the bottom of the quartz plate 132 and measures the temperature of the copper forming sheet on which the graphene or other product will be formed. The sensors are useful for starting the manufacturing process and for detecting faults or errors in the manufacturing process but are not absolutely necessary for the manufacturing itself.

What is claimed is:

1. A method of making 2D material comprising:
providing a reaction chamber including:
a gas confining space extending through the reaction chamber from a chamber entrance to a chamber exit, the chamber entrance and chamber exit being open to a surrounding atmosphere,
a support extending through the gas confining space of the reaction chamber from the chamber entrance to the chamber exit, and
a plurality of carriers positioned on the support, each of the plurality of carriers including a forming layer suitable for producing 2D material disposed on a surface of the carrier,
introducing one or more purge gases into the gas confining space to purge the gas confining space of oxygen and to establish a laminar flow of gases throughout the gas confining space, the laminar flow of gases consisting of a first forward flow path from a middle portion of the gas confining space through the chamber entrance and a second rearward flow path from the middle portion of the gas confining space through the chamber exit;
introducing a donor gas into the laminar flow of gases after the laminar flow of gases has been established;
moving the plurality of carriers along the support through the gas confining space from the chamber entrance and through the chamber exit while the chamber entrance and chamber exit are open to a surrounding atmosphere and the donor gas is being introduced into the gas confining space;
maintaining a positive pressure relative to the surrounding atmosphere throughout the gas confining space during the moving step; and
heating the forming layers to a temperature sufficient to produce 2D material as the plurality of carriers are moved through the gas confining space.

2. The method of claim 1 wherein the step of introducing the donor gas includes supplying the donor gas into the gas confining space at a flow rate that produces a non-turbulent, laminar flow of donor gas across the forming layer during production of 2D material on the forming layer.

3. The method of claim 1 wherein the step of introducing the donor gas includes continuously introducing at least the donor gas into the gas confining space of the reaction chamber after purging the gas confining space of the reaction chamber and the step of moving the plurality of carriers includes continuously moving new carrier substrates with at least one forming layer on each carrier substrate through the reaction chamber to form a stream of carrier substrates that moves into and through the gas confining space of the reaction chamber.

4. The method of claim 1 wherein the step of introducing purge gas into the gas confining space includes flowing the purge gas out of the gas confining space through at least the chamber entrance.

5. The method of claim 1 further comprising continuously introducing at least one of the purge gas, the donor gas, and a combination thereof into the gas confining space for maintaining the positive pressure.

6. The method of claim 5 further comprising continuously flowing at least a portion of the continuously introduced gases in a first direction for maintaining the first forward flow path through the chamber entrance and continuously flowing at least a portion of the continuously introduced gases in a second direction for maintaining the second rearward flow path through the chamber exit.

7. The method of claim 1 further comprising positioning each of the plurality of carriers on the support to form a train of carriers, and wherein the moving step further includes driving the train of carriers through the gas confining space such that each carrier pushes another carrier in front of the carrier.

8. The method of claim 7 further comprising providing a drive mechanism disposed at least partially outside the gas confining space driving the train of carriers through the gas confining space along the support.

9. A method of forming 2D material comprising:
providing a reaction chamber including a gas confining space extending through the reaction chamber from a chamber entrance to a chamber exit, a support extending through the gas confining space, and a plurality of carriers positioned on the support for supporting a forming layer suitable for forming 2D material, the chamber entrance and the chamber exit being open to the atmosphere around the reaction chamber;
heating the gas confining space;
introducing one or more purge gases into the gas confining space to purge the gas confining space of oxygen and to establish a laminar flow of gases throughout the gas confining space, the laminar flow of gases consisting of a first forward flow path from a middle portion of the gas confining space through the chamber entrance and a second rearward flow path from the middle portion of the gas confining space through the chamber exit;
introducing a donor gas into the laminar flow of gases after the laminar flow of gases has been established;
positioning the forming layer on the plurality of carriers;
moving the plurality of carriers along the support through the gas confining space from the chamber entrance and through the chamber exit to react with the donor gas to form 2D material while the gas confining space is open to the atmosphere; and
maintaining a positive pressure relative to the surrounding atmosphere throughout the gas confining space during the moving step.

10. The method of claim 9 wherein the forming layer includes a plurality of forming layers each carried by one of the plurality of carriers.

11. The method of claim 9 wherein the forming layer includes a single forming layer carried by two or more of the plurality of carriers.

12. The method of claim 8 wherein the moving step further includes driving the plurality of carriers along the support via one or more drive surfaces disposed at least partially outside the gas confining space.

13. The method of claim 12 wherein the plurality of carriers are supported by a plurality of rollers as they are driven along the support.

14. The method of claim 9 wherein the moving step further includes propelling the plurality of carriers on a cushion of gas through the gas confining space.

15. The method of claim 9 wherein the forming layer is a continuous sheet secured at a first end by a first roller adjacent the chamber entrance and secured at a second end to a second roller adjacent the chamber exit, the moving step further includes transporting the continuous sheet through the gas confining space by rolling the continuous sheet off the first roller onto the second roller while the forming sheet is supported by the plurality of carriers.

16. The method of claim 9 wherein the heating step includes heating the gas confining space to a temperature of at least 900 C.

17. The method of claim 9 wherein the 2D material is graphene.

18. The method of claim 9 wherein the reaction chamber is formed of one or more materials selected from the group consisting of quartz, fused silica, fused quartz, and ceramics.

19. The method of claim 1 wherein the step of introducing the donor gas into the laminar flow of gases includes introducing the donor gas into only the second rearward flow path.

20. The method of claim 9 wherein the step of introducing the donor gas into the laminar flow of gases includes introducing the donor gas into only the second rearward flow path.

* * * * *